US007016215B2

(12) United States Patent
Kamoshida et al.

(10) Patent No.: US 7,016,215 B2
(45) Date of Patent: Mar. 21, 2006

(54) FERROELECTRIC MEMORY DEVICE WITH A SPARE MEMORY CELL ARRAY

(75) Inventors: Masahiro Kamoshida, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/654,915

(22) Filed: Sep. 5, 2003

(65) Prior Publication Data

US 2004/0114414 A1 Jun. 17, 2004

(30) Foreign Application Priority Data

Sep. 6, 2002 (JP) ............................ 2002-261251

(51) Int. Cl.
*G11C 11/22* (2006.01)
*G11C 8/08* (2006.01)

(52) U.S. Cl. .................. 365/145; 365/200; 365/230.06

(58) Field of Classification Search ................ 365/145, 365/200, 230.06
See application file for complete search history.

(56) References Cited

U.S. PATENT DOCUMENTS 5,903,492 A * 5/1999 Takashima .................. 365/145
6,157,585 A * 12/2000 Kim ........................... 365/200
6,246,616 B1 * 6/2001 Nagai et al. ................ 365/200
6,301,152 B1 * 10/2001 Campardo et al. ..... 365/185.09
6,310,806 B1 10/2001 Higashi et al. ............. 365/200

FOREIGN PATENT DOCUMENTS

| | | |
|---|---|---|
| JP | 62-52800 | 3/1987 |
| JP | 8-329686 | 12/1996 |
| JP | 10-255483 | 9/1998 |
| JP | 2001-184858 | 7/2001 |
| JP | 2002-170382 | 6/2002 |
| JP | 2002-216470 | 8/2002 |
| JP | 2002-279793 | 9/2002 |

* cited by examiner

*Primary Examiner*—Richard Elms
*Assistant Examiner*—J. H. Hur
(74) *Attorney, Agent, or Firm*—Oblon, Spivak, McClelland, Maier & Neustadt, P.C.

(57) ABSTRACT

A memory device comprises a normal memory cell array and a spare memory cell array, in which memory cells each comprising a ferroelectric capacitor are arranged; a normal word line; a normal word line driver; a spare word line; a spare word line driver; an address input circuit to which an address signal is inputted; and a judging circuit which compares an input address with a faulty address and generates an output for selecting one of the normal and spare word line drivers according to the comparison. The normal and spare word line drivers are simultaneously selected by an output of the address input circuit to start driving the normal and spare word lines, and thereafter the normal and spare word line drivers are enabled by the output of the judging circuit to stop the driving of one of the normal and spare word lines and continue the other.

8 Claims, 15 Drawing Sheets

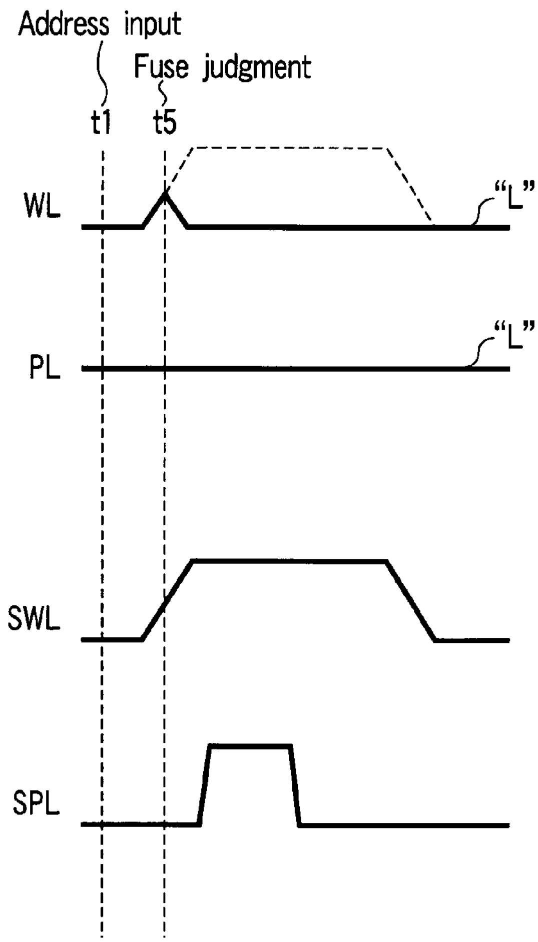
F I G. 4
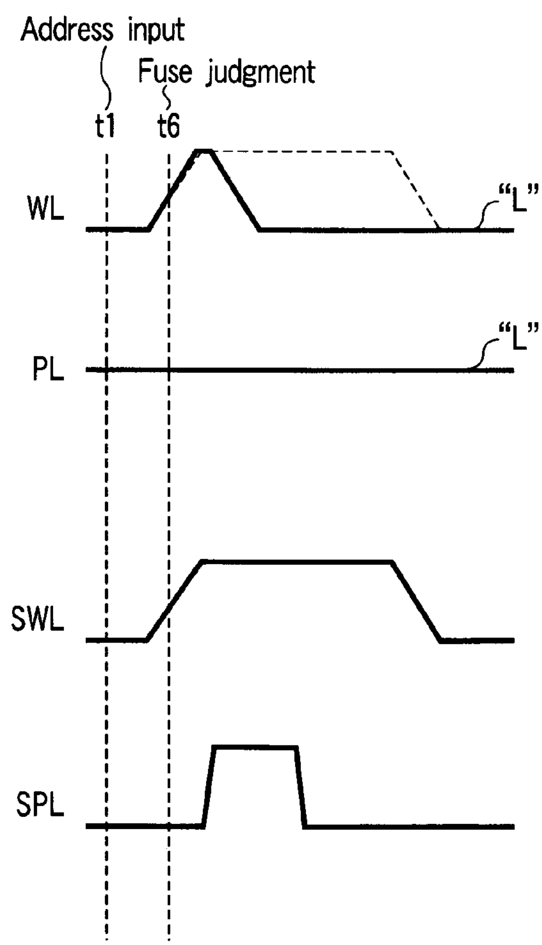
F I G. 5

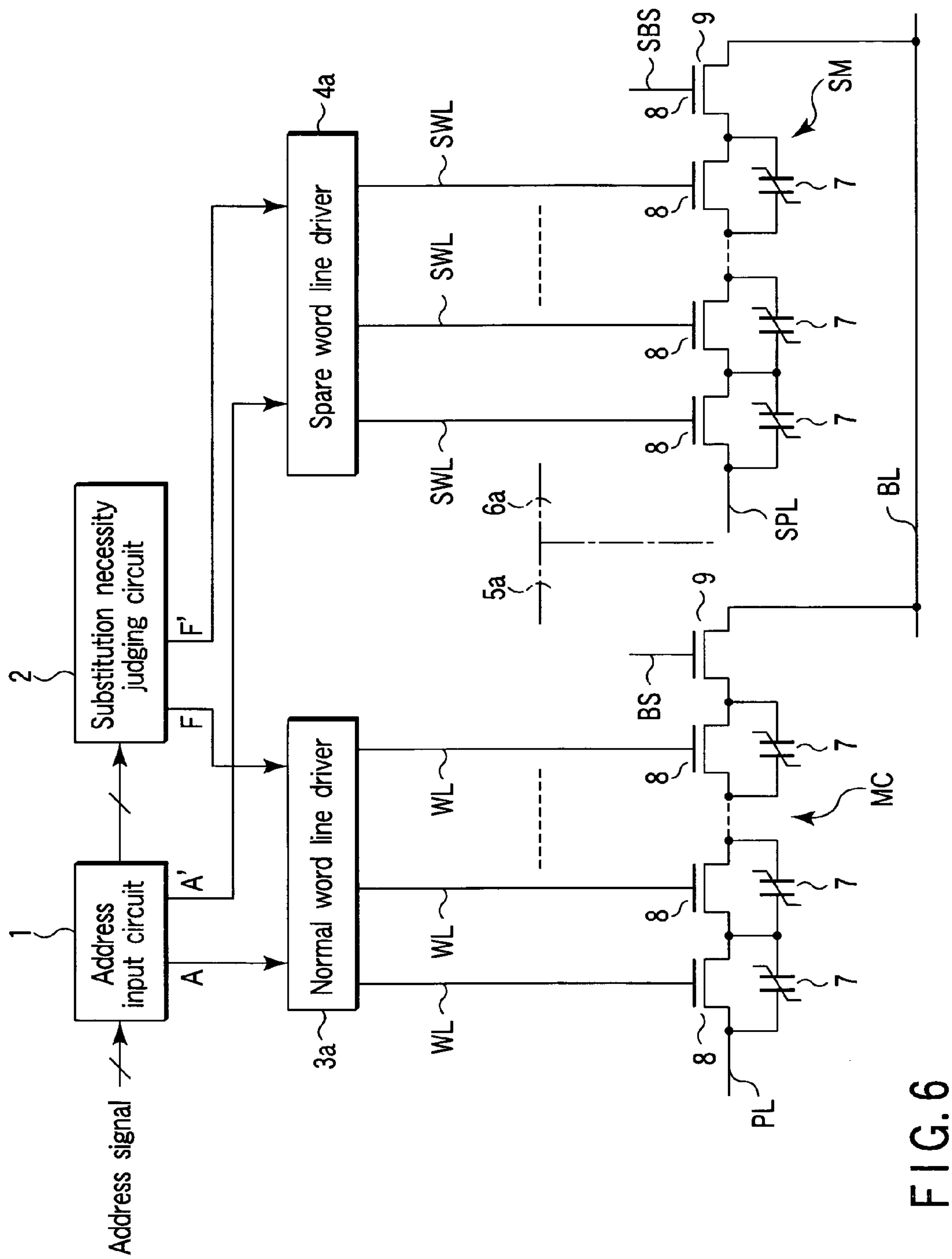
F I G. 6

Selection

Nonselection

Selection

Nonselection

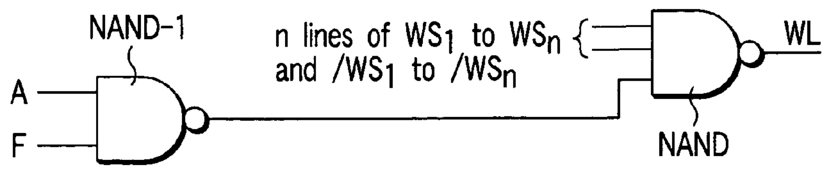
FIG. 17A
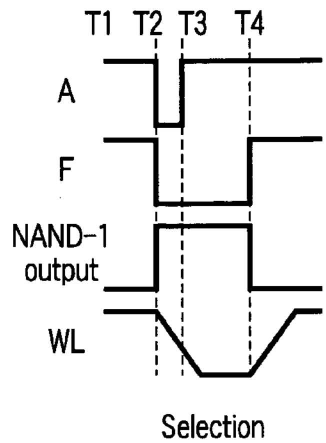
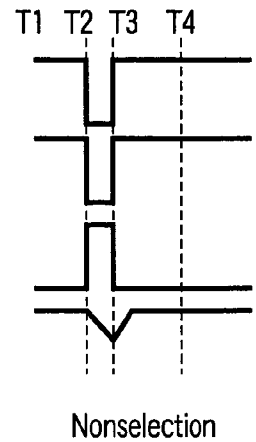
FIG. 17B FIG. 17C
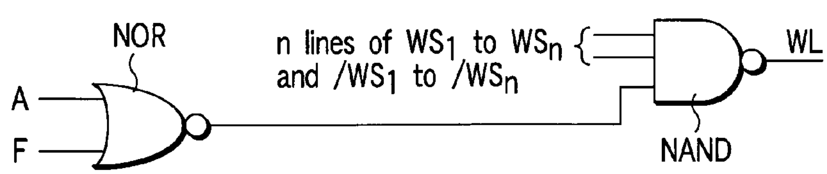
FIG. 18A
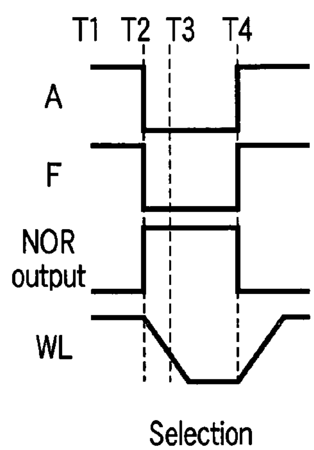
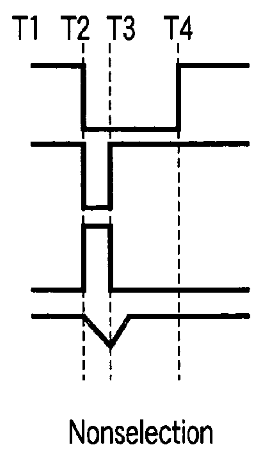
FIG. 18B FIG. 18C

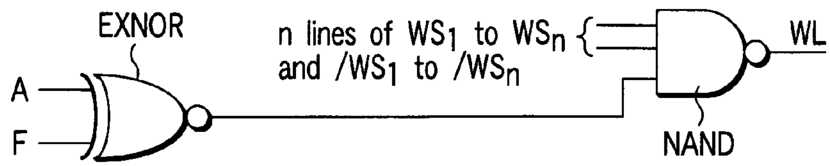
FIG. 19A
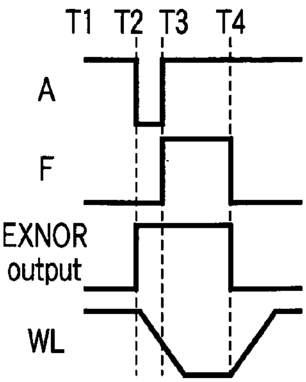
Selection
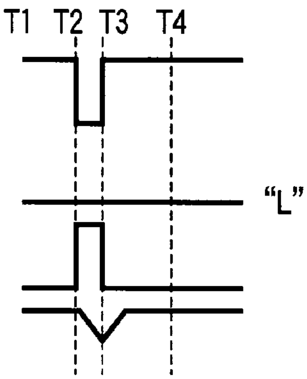
Nonselection
FIG. 19B FIG. 19C
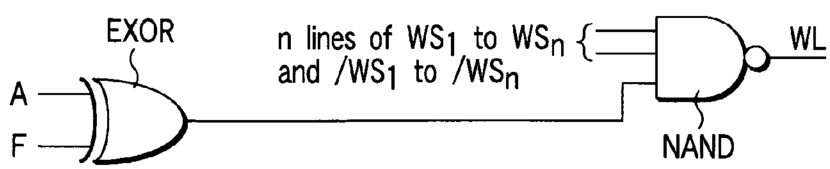
FIG. 20A
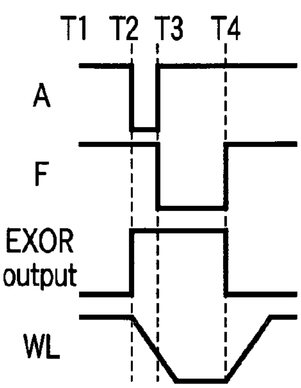
Selection
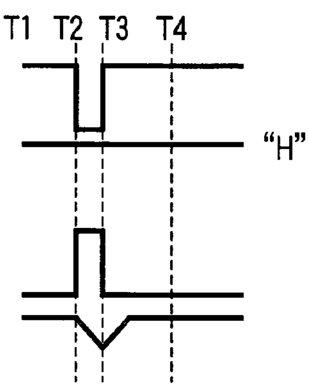
Nonselection
FIG. 20B FIG. 20C Selection Nonselection Selection Nonselection

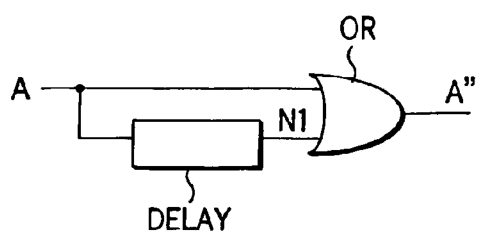
F I G. 23A
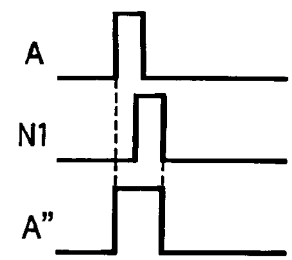
F I G. 23B

FERROELECTRIC MEMORY DEVICE WITH A SPARE MEMORY CELL ARRAY

CROSS-REFERENCE TO RELATED APPLICATIONS

This application is based upon and claims the benefit of priority from the prior Japanese Patent Application No. 2002-261251, filed Sep. 6, 2002, the entire contents of which are incorporated herein by reference.

BACKGROUND OF THE INVENTION

1. Field of the Invention

The present invention relates to a nonvolatile semiconductor memory device, particularly relates to a word line selecting circuit of normal memory cell/spare memory cell for an array of memory cells, in which a ferroelectric capacitor is used, and the circuit used for, e.g. a ferroelectric memory integrated circuit.

2. Description of the Related Art

Recently the ferromagnetic memory (FeRAM) having an array of memory cells in which the ferroelectric capacitor is used receives much attention as one of nonvolatile memories. FeRAM has advantages such that rewritability is the order of $10^{12}$, read/write cycles are comparable to DRAM, and operation voltage is low-voltage of 2.5 to 5V.

FIG. 9 shows a part of an array of FeRAM cells having one transistor/one capacitor configuration. This cell array is the same as that of DRAM except the configuration of the cell itself is different from that of DRAM.

In FIG. 9, the normal memory cell and the spare memory cell for storing information includes a ferroelectric capacitor 7 having a structure in which a ferroelectric film is sandwiched between two electrodes, and a transistor (selecting transistor) 8 for selecting the cell, the normal memory cell and the spare memory cell are connected to the same bit line BL.

One electrode of the ferroelectric capacitor 7 of the normal memory cell is connected to a plate line PL, and the other electrode of the ferroelectric capacitor 7 of the normal memory cell is connected to a bit line BL via a selecting transistor 8. A gate of the selecting transistor 8 of the normal memory cell is connected to a normal word line WL.

One electrode of the ferroelectric capacitor 7 of the sparel memory cell is connected to a spare plate line SPL, and the other electrode of the ferroelectric capacitor 7 of the spare memory cell is connected to the bit line BL via a selecting transistor 8. A gate of the selecting transistor 8 of the spare memory cell is connected to a spare word line SWL.

FIG. 10 shows a part of the array of TC-parallel-unit series connection type of ferroelectric memory cells. The configuration of the TC-parallel-unit series connection type of ferroelectric memory cell is described in Jpn. Pat. Appln. KOKAI Publication No. 10-255483 applied by the applicant.

That is, in FIG. 10, the normal memory cell and the spare memory cell have the configuration in which a plurality of cell units, in which the ferroelectric capacitors 7 are connected in parallel between a source and a drain of the cell transistor 8, are connected in series (TC-parallel-unit series connection type of ferroelectric memory cell).

In this case, one terminal of the normal memory cell is connected to a plate line PL, the other terminal of the normal memory cell is connected to the bit line BL through a block selecting transistor 9, the gate of the block selecting transistor 9 is connected to a block selecting line BS, and the gate of each selecting transistor 8 is correspondingly connected to an individual word line WL.

On the other hand, one terminal of the spare memory cell is connected to a spare plate line SPL, the other terminal of the spare memory cell is connected to the bit line BL through the block selecting transistor 9, the gate of the block selecting transistor 9 is connected to a spare block selecting line SBS, and the gate of each selecting transistor 8 is correspondingly connected to an individual spare word line SWL.

FIG. 24 is a block diagram showing a part of the conventional example of a circuit of a word line selecting system and the cell array in FeRAM having the cell array shown in FIG. 9.

An address input circuit 91 has a function of waveform-shaping an inputted address signal.

A substitution requirement judging circuit 92 stores an address, e.g. in a fuse element in substituting the normal memory cell for the spare memory cell, compares an input address supplied from the address input circuit 91 with the stored address to judge whether the substitution is required or not, and drives a normal word line driver 93 or a spare word line driver 94 according to the judgment result.

Drive output of the normal word line drivers 93 is supplied to the normal word line WL connected to the normal memory cell of a normal cell array 95, and the drive output of the spare word line drivers 94 is supplied to the spare word line SWL connected to the spare memory cell of a spare cell array 96.

Though it is not shown, a normal plate line driver for driving the normal plate line PL connected to the normal memory cell and a spare plate line driver for driving the spare plate line SPL connected to the spare memory cell are provided.

FIG. 25 is a waveform chart showing an operation example in the case where the spare word line SWL is selected by using the circuit of the word line selecting system of the conventional example shown in FIG. 24 in the array of FeRAM cells having the one transistor/one capacitor configuration, which is shown in FIG. 9.

The address signal is inputted at time t1 and the substitution requirement judging circuit 2 judges (fuse-judges) at time t2 that the substitution is required by comparing the input address with the address stored in the fuse element. As a result, potentials of the normal word line WL and the normal plate line PL, which have not been selected, are fixed to an "L" level respectively, and read/write operation of the memory cell is not carried out.

On the contrary, the read/write operation of the spare memory cell is carried out in such a manner that the selected spare word line SWL is driven to an "H" level and then the spare plate line SPL is driven to the "H" level.

FIG. 26 is a waveform chart showing an operation example in the case where the spare word line SWL is selected by using the circuit of the word line selecting system and the cell array of the conventional example shown in FeRAM having the array of the TC-parallel-unit series connection type of ferroelectric memory cells shown in FIG. 10.

When the address signal is inputted at time t1 and the judgment is carried out at time t2 by the substitution requirement judging circuit 2, the potential of the normal word line WL which has not been selected is fixed to the "H" level, the potentials of the normal plate line PL and the block selecting line BS which have not been selected are fixed to the "L" level, and read/write operation of the memory cell is not carried out.

On the contrary, the read/write operation of the spare memory cell is carried out in such a manner that the selected spare word line SWL is driven to the "L" level, and then the block selecting line BS is driven to the "H" level to connect the spare memory cell to the bit line BL, and the spare plate line SPL is driven to the "H" level.

However, in the circuit of the word line selecting system of the conventional example shown in FIG. 24, after the address signal is inputted to the address input circuit 1, according to the result of comparison of the input address and the stored address in the substitution requirement judging circuit 2, it is judged whether the normal word line WL for the normal memory cell of the normal cell array 5 or the spare word line SWL for the spare memory cell of the spare cell array 6 is selected, so that delay of access time is generated.

As described above, there is a problem that the access time is lengthened in the word line selecting circuit of the conventional FeRAM.

BRIEF SUMMARY OF THE INVENTION

According to an aspect of the present invention, there is provided a semiconductor memory device comprising:

a normal memory cell array in which a plurality of normal memory cells each comprising a ferroelectric capacitor are arranged;

a normal word line which is connected to the normal memory cells of the normal memory cell array;

a normal word line driver which selectively drives the normal word line;

a spare memory cell array in which a plurality of spare memory cells each comprising a ferroelectric capacitor are arranged, the spare memory cells being used as a substitution of a faulty normal memory cell of the normal memory cell array;

a spare word line which is connected to the spare memory cells of the spare cell array;

a spare word line driver which selectively drives the spare word line;

an address input circuit to which an address signal for selectively specifying the memory cells is inputted; and a judging circuit which compares an address inputted in the address input circuit with a faulty address previously stored and generates an output signal for selecting one of the normal word line driver and spare word line driver according to a result of the comparison, wherein the normal word line driver and spare word line driver are simultaneously selected by an output signal of the address input circuit to start driving the normal word line and spare word line, and after the start of the driving, the normal word line driver and spare word line driver are selected by the output signal of the judging circuit to stop the driving of one of the normal word line and spare word line and continue the other of the driving of the normal word line and spare word line.

According to another aspect of the present invention, there is provided a semiconductor memory device comprising:

a normal memory cell array in which a plurality of normal memory cells each comprising a ferroelectric capacitor are arranged;

a spare cell array in which a plurality of spare memory cells each comprising the ferroelectric capacitor for substitution of a faulty normal memory cell of the normal memory cell array are arranged;

a normal word line driver and a spare word line driver which, in accessing to a faulty normal memory cell of the normal memory cell array or to a spare memory cell of the spare cell array for substituting the faulty memory cell, simultaneously start driving a normal word line connected to the faulty normal memory cell and a spare word line connected to the spare memory cell, and thereafter stop the driving of one of the normal word line and spare word line and continue the driving of the other of the normal word line and spare word line.

BRIEF DESCRIPTION OF THE SEVERAL VIEWS OF THE DRAWING

FIG. 4 is a waveform chart showing a first example of operation in the case where a spare word line SWL is selected in the FeRAM of the first embodiment of the present invention;

FIG. 5 is a waveform chart showing a second example of the operation in the case where the spare word line SWL is selected in the FeRAM of the first embodiment of the present invention;

FIG. 6 is a block diagram showing a configuration of an associated circuit portion of a word line selecting system and a part of a memory cell array in the FeRAM according to a second embodiment of the present invention;

FIG. 17A is a circuit diagram showing a first example of the word line driver 3*a* in FIG. 6 for realizing the operation of FIG. 7;

FIG. 17B is a timing waveform chart showing an operation example of a selected state of a word line by the word line driver of FIG. 17A;

FIG. 17C is a timing waveform chart showing an operation example of a non-selected state of a word line by the word line driver of FIG. 17A;

FIG. 18A is a circuit diagram showing a second example of the word line driver 3*a* in FIG. 6 for realizing the operation of FIG. 7;

FIG. 18B is a timing waveform chart showing an operation example of a selected state of a word line by the word line driver of FIG. 18A;

FIG. 18C is a timing waveform chart showing an operation example of a non-selected state of a word line by the word line driver of FIG. 18A;

FIG. 19A is a circuit diagram showing a third example of the word line driver 3*a* in FIG. 6 for realizing the operation of FIG. 7;

FIG. 19B is a timing waveform chart showing an operation example of a selected state of a word line by the word line driver of FIG. 19A;

FIG. 19C is a timing waveform chart showing an operation example of a non-selected state of a word line by the word line driver of FIG. 19A;

FIG. 20A is a circuit diagram showing a fourth example of the word line driver 3*a* in FIG. 6 for realizing the operation of FIG. 7;

FIG. 20B is a timing waveform chart showing an operation example of a selected state of a word line by the word line driver of FIG. 20A;

FIG. 20C is a timing waveform chart showing an operation example of a non-selected state of a word line by the word line driver of FIG. 20A;

FIG. 23A is a circuit diagram showing an example of a circuit used to realize the operation of FIG. 5 and FIG. 8;

FIG. 23B is a timing waveform chart showing the operation example of the circuit of FIG. 23A;

DETAIL DESCRIPTION OF THE INVENTION

Preferred embodiments of the invention will be described below in detail referring to the accompanying drawings.

Figure 1:
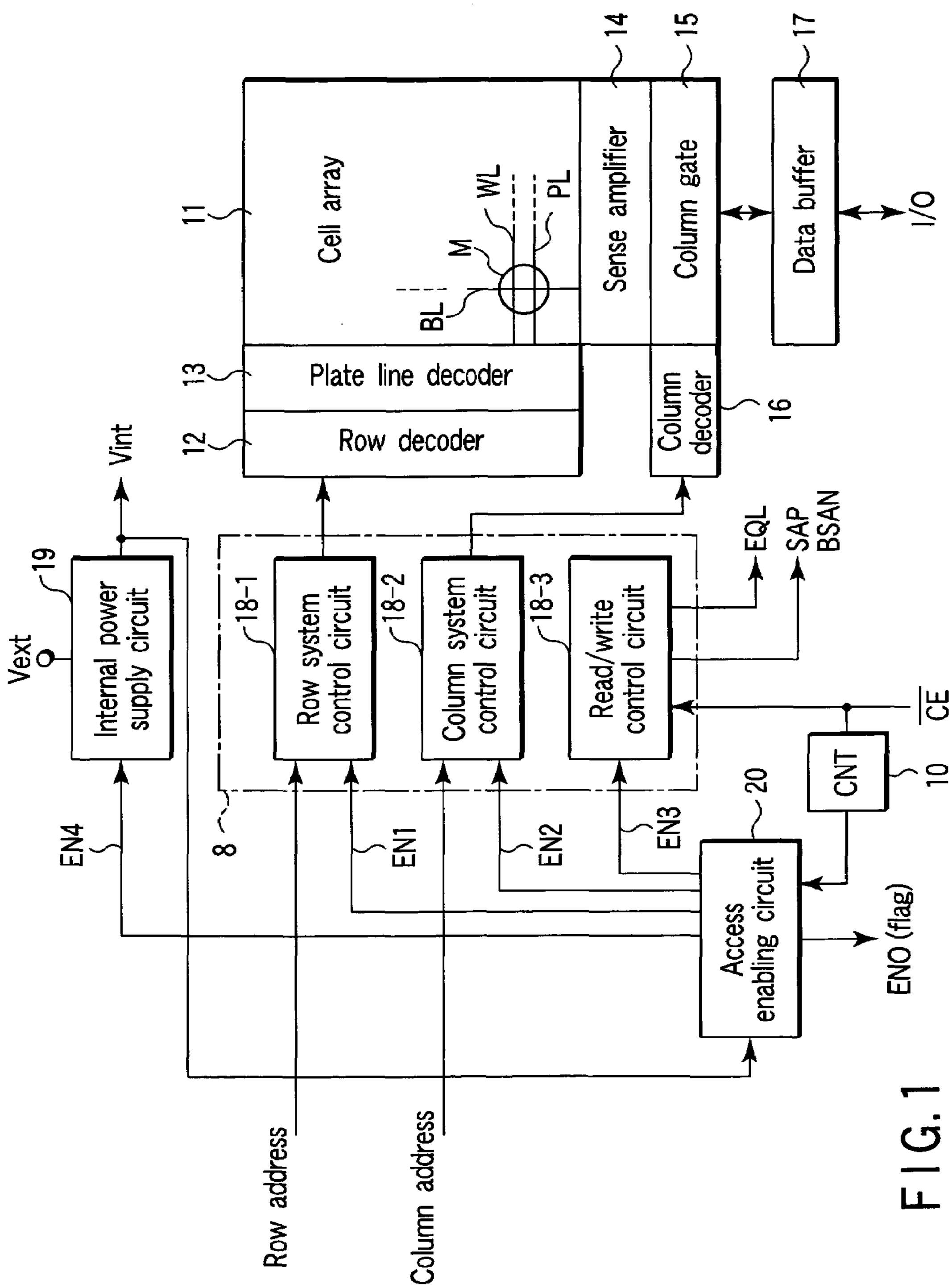
FIG. 1 is a block diagram schematically showing an entire configuration of FeRAM according to embodiments of the present invention.

FIG. 1 is a block diagram schematically showing an entire configuration of FeRAM according to embodiments of the present invention.

A memory cell array 11 is formed of a plurality of memory cells M each including a ferroelectric capacitor and a transistor, in which a word line WL, a plate line PL, and a bit line BL are arranged. Reference numeral 12 is a row decoder which selects and drives the word line WL in the memory cell array 11 and reference numeral 13 is a plate line decoder which selects and drives the plate line PL.

Figure 9:
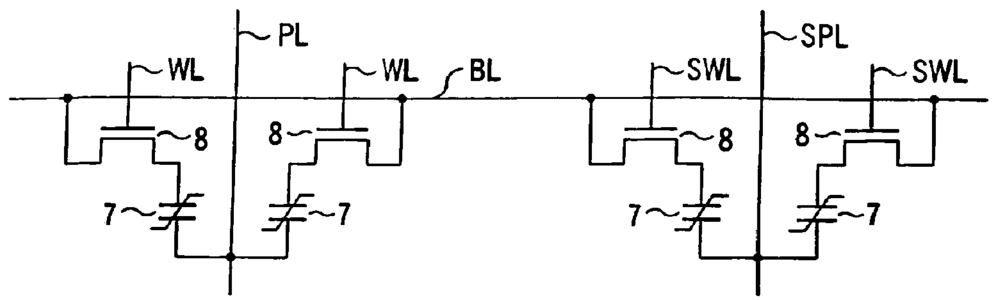
FIG. 9 is a circuit diagram showing a part of an array of FeRAM cells having one transistor/one capacitor configuration in FeRAM.
Figure 10:
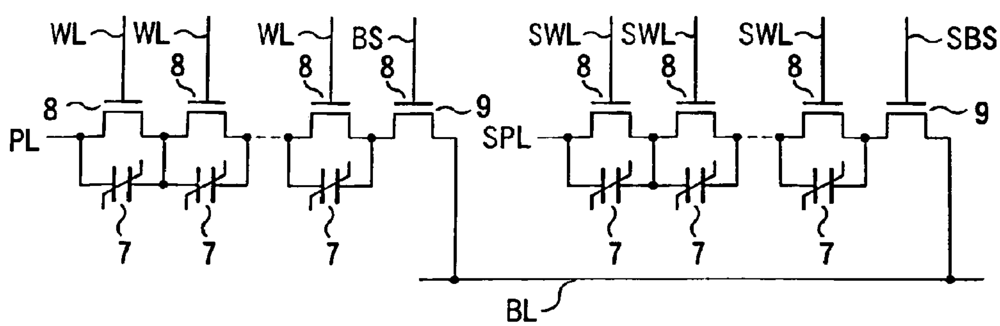
FIG. 10 is a circuit diagram showing a part of an array of TC-parallel-unit series connection type of ferroelectric memory cells in FeRAM.

The memory cells M have a one transistor/one capacitor configuration as shown in FIG. 9 or a TC-parallel-unit series connection type of ferroelectric memory cell as shown in FIG. 10. The word line WL is commonly connected to the cell transistors on the same row.

Though it is not shown in FIG. 1, the memory cell array 11 includes a spare memory cell array aside from the normal memory cell array. A spare word line, a spare row decoder, a spare plate line PL, and a spare row decoder are provided corresponding to the spare memory cell.

In the case where the normal memory cells M and the spare memory cells are of one transistor/one capacitor configuration and the normal memory cells M are to be substituted by the spare memory cells in units of one word line, the normal row decoders corresponding to the normal word lines are substituted by the spare row decoders in units of one row decoder.

On the other hand, in the case that the memory cell M and the spare memory cell are of TC-parallel-unit series connection type of ferroelectric memory cell and the normal memory cells M are to be substituted by the spare memory cells in units of a plurality of word lines, eight lines in this embodiment, which belong to one memory cell, the normal row decoders are substituted by the spare row decoders in units of eight row decoders corresponding to eight word lines. However, this substitution is not limited to the units of a plurality of word lines.

Reference numeral 14 is a sense amplifying circuit which detects and amplifies read data on the bit line BL of the memory cell array 11, 15 is a column gate for selecting the column of the memory cell array 11, 16 is a column decoder for selecting the column gate 15, and 17 is a data buffer for inputting/outputting the data between the sense amplifying circuit 14 and an I/O terminal.

A control circuit 18 for controlling the read/write of the memory cell array 11 has a row system control circuit 18-1, a column system control circuit 18-2, and a read/write control circuit 18-3.

The row system control circuit 18-1 captures a row address to control the row decoder 12 and the plate line decoder 13. The column system control circuit 18-2 captures a column address to control the column decoder 16. The read/write control circuit 18-3 generates a bit line equalizing signal EQL and sense amplifier activating signals SAP, BSAN, etc.

An internal power supply circuit 19 is provided in the memory chip. The internal power supply circuit 19 is supplied with an external power supply voltage Vext and generates internal power supply voltage Vint. The internal power supply circuit 19 may include a booster circuit for generating a boosted voltage as necessary.

A chip enabling signal /CE supplied from the outside of the chip sets the memory chip to an active state. That is, usually the control circuit 18 causes the memory cell array to become an accessible state when the external power supply is turned on and the chip enabling signal /CE is turned to "L".

However, in the circuit of FIG. 1, even if the external power supply is turned on and the chip enabling signal /CE is turned to "L", the access to the memory cell 11 does not immediately start. Specifically, a counter 10 for counting a fall edge of the chip enabling signal /CE is provided, and an access enabling circuit 20 which detects a count value of the counter 10 having reached a predetermined value and generates an access enabling signal EN (EN0 to EN4) is provided. The access enabling circuit 20 sets a predetermined grace period after turning on the power supply and enables the access to the memory cell array 11 after a lapse of the grace period.

The access enabling circuit 20 also monitors the internal power supply voltage Vint outputted from the internal power supply circuit 19. This allows the access enabling circuit 20 to outputs the access enabling signal EN when the internal power supply voltage Vint reaches a predetermined level. Specifically, an AND logic of the judgment of the count value of the counter 10 by the access enabling circuit 20 and the judgment of the internal power supply voltage Vint by the access enabling circuit 20 may be used as conditions of generating the access enabling signal EN. Alternatively, only one of the judgment of the count value of the counter 10 and the judgment of the internal power supply voltage Vint may be used as conditions of generating the access enabling signal EN.

In the example of FIG. 1, signals EN0, EN1, EN2, and EN3 are shown as the access enabling signal EN. The signal EN1 is a signal inputted into the row system control circuit 18-1, the signal EN2 is a signal inputted into the column system control circuit 18-2, the signal EN3 is a signal inputted into the read/write control circuit 18-3, the signal EN4 is a signal inputted into the internal power supply circuit 19, and the signal EN0 is a signal outputted to outside as a flag. These signals EN0 to EN4 may be used as one signal or individual signals whose timing is slightly shifted from each other according to an object circuit.

Figure 2:
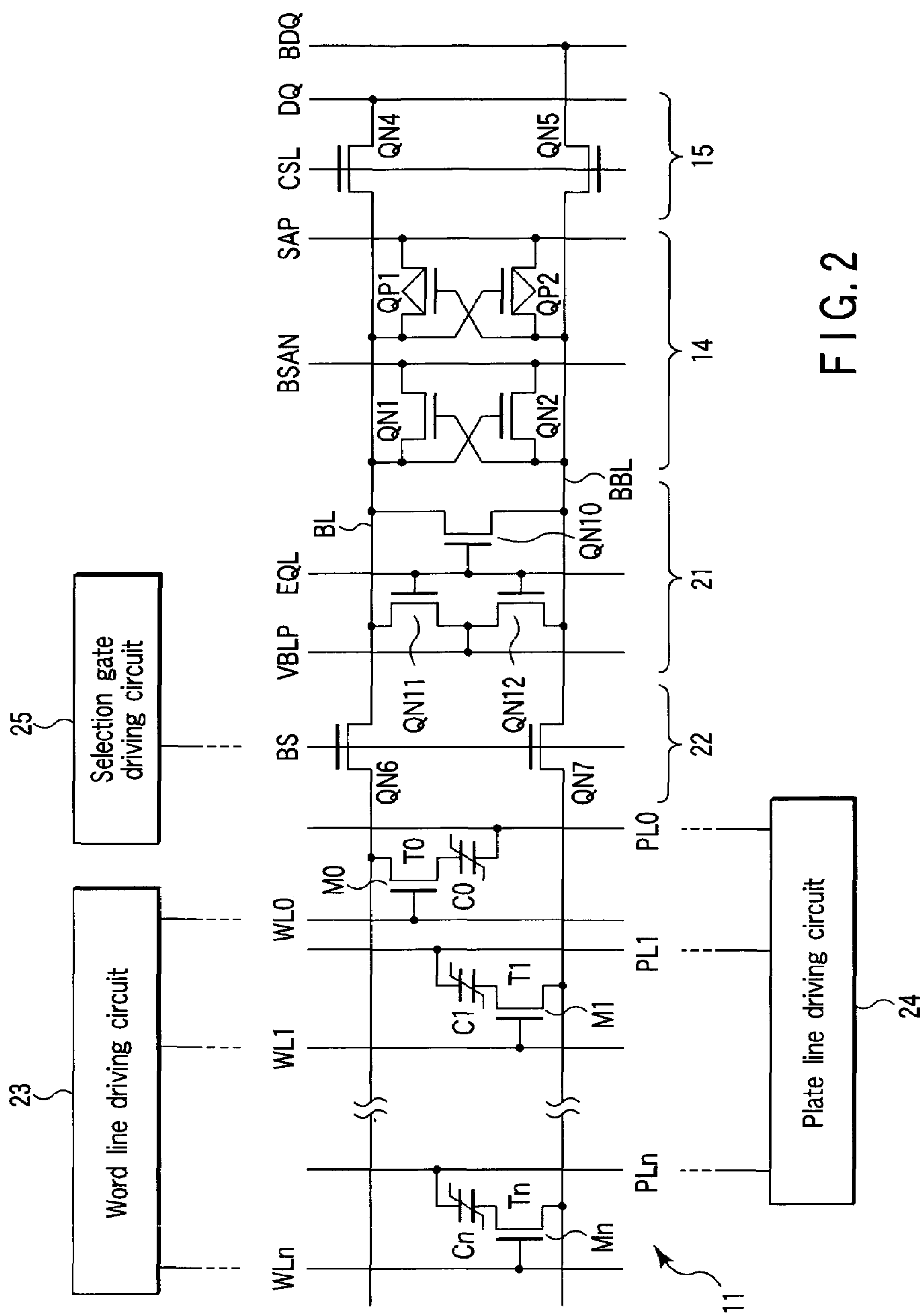
FIG. 2 is a circuit diagram showing an example of an associated circuit portion of a pair of bit lines BL and BBL in a memory cell array 11 shown in FIG. 1.

FIG. 2 is a circuit diagram showing an example of a circuit portion associated with a complimentary pair of bit lines BL and BBL in the memory cell array 11 shown in FIG. 1. In FIG. 2, one transistor Ti/one capacitor Ci configuration type memory cells are shown as an example of the memory cells Mi (i=0 to n).

A gate of a transistor Ti is connected to a word line WLi, a drain of the transistor Ti is connected to the bit line BL, and one terminal (plate electrode) of a ferroelectric capacitor Ci is connected to a plate line PLi.

The pair of bit lines BL and BBL is separated between the inside of the cell array on the one hand and a bit line equalizing circuit 21 and the bit line sense amplifying circuit 14 on the other hand by means of NMOS transistors QN6 and QN7 which from a selection gate 22.

The sense amplifying circuit 14 includes an NMOS flip-flop including NMOS transistors QN1 and QN2 and a PMOS flip-flop including PMOS transistors QP1 and QP2.

The column gate 15 is inserted between the bit lines BL and BBL on the one hand and data lines DQ and BDQ on the other hand. The column gate 15 includes NMOS transistor QN4 and QN5 which are controlled by the column decoder 16.

The bit line equalizing circuit 21 comprises an equalizing NMOS transistor QN10 and pre-charging NMOS transistors QN11 and QN12. The equalizing NMOS transistor QN10 makes a short-circuit between the bit lines BL and BBL. The pre-charging NMOS transistors QN11 and QN12 have one terminals connected to the bit line BL and BBL, respectively, and precharge the bit line BL and BBL. The gates of these transistors are commonly controlled by an equalizing signal EQL.

A word line driving circuit 23 is included in the row decoder 12 of the circuit shown in FIG. 1 and drives the word line WLi. A plate line driving circuit 24 is included in the plate line decoder 13 of the circuit shown in FIG. 1 and drives the plate line PLi.

A selector gate driving circuit 25 is selectively activated by a block decoder included in the row system control circuit 18-1 in FIG. 1 and drives the selector gate 22.

<First Embodiment>

The configuration and operation will be described below as a first embodiment of the present invention, in which the FeRAM in FIG. 1 includes an array of the one transistor/one capacitor type memory cells, which has been described referring to FIG. 9.

Figure 3:
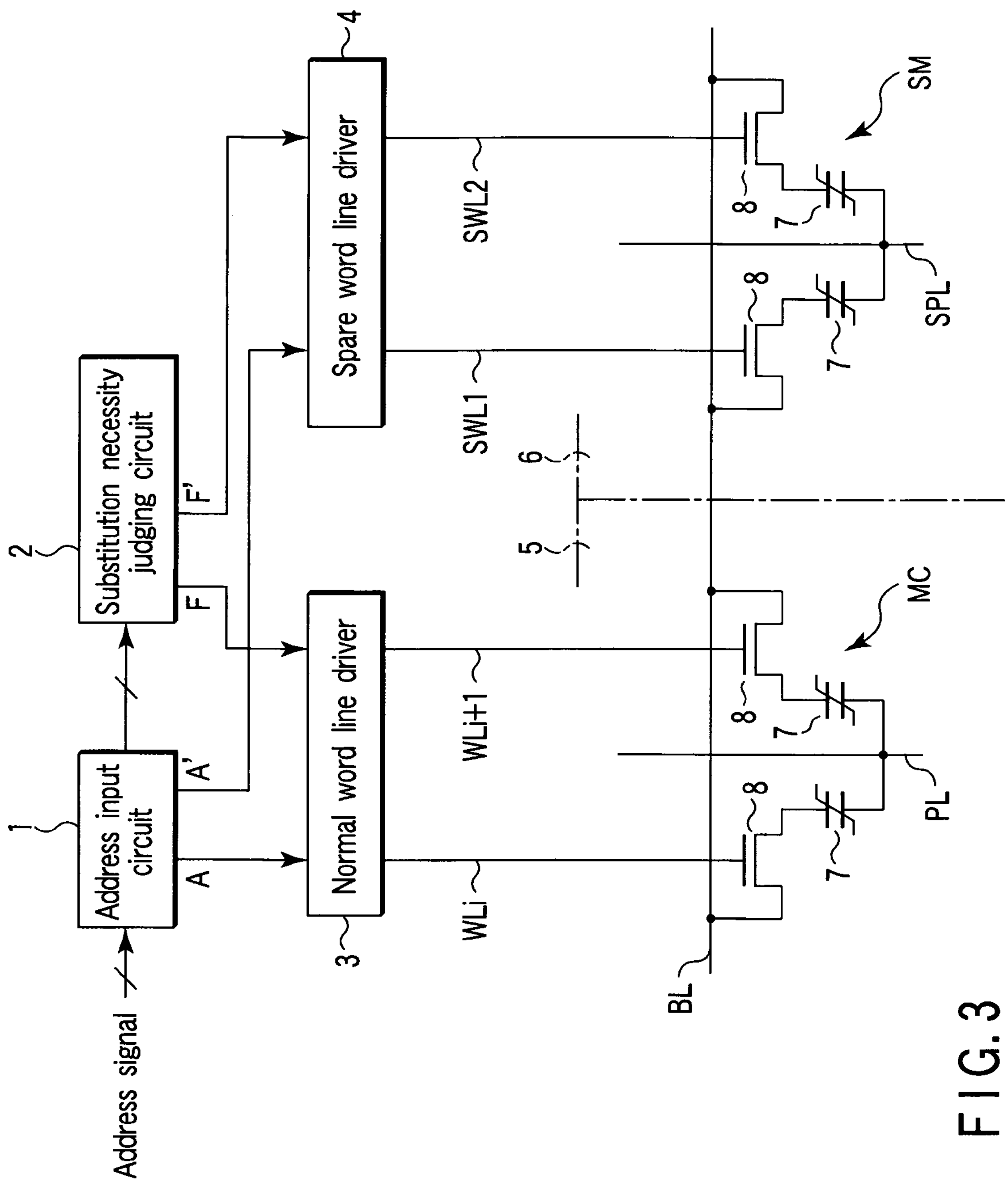
FIG. 3 is a block diagram showing a configuration of an associated circuit portion of a word line selecting system and a part of a memory cell array in the FeRAM according to a first embodiment of the present invention.

FIG. 3 is a block diagram showing a part of the FeRAM of FIG. 1, which includes circuits associated with the word line selection and parts of the memory cell array and spare memory cell array.

Figure 24:
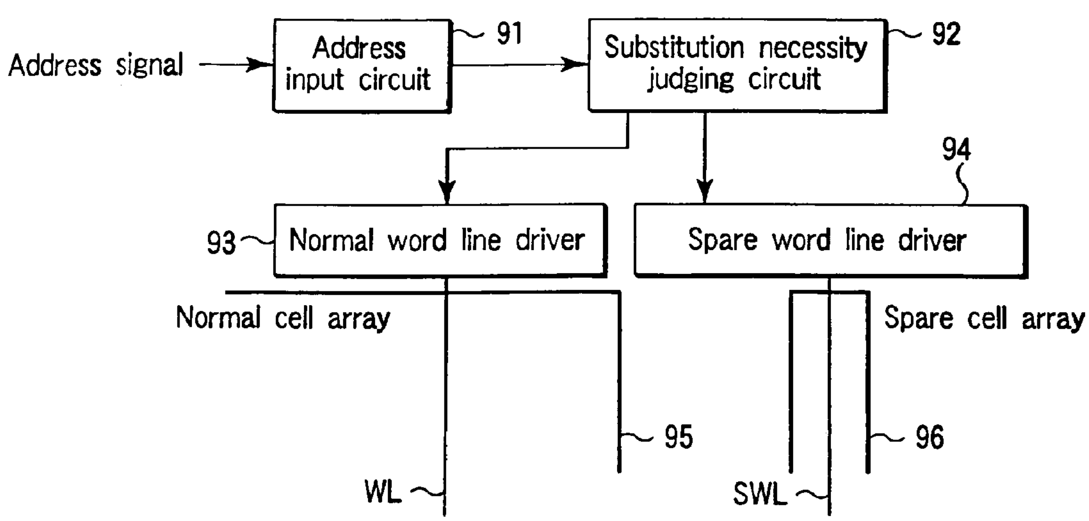
FIG. 24 is a block diagram showing a part of a conventional example of a circuit of a word line selecting system and a cell array in FeRAM having the cell array shown in FIG. 9.

This circuit differs from the conventional circuit of the word line selecting system, which has been described referring to FIG. 24, in that output of the address input circuit 1 is also directly supplied to the word line driver 3 and the spare word line driver 4 besides being supplied to the substitution requirement judging circuit 2 (also referred to as a fuse judging circuit in the case where fuse data is used).

That is, in FIG. 3, reference numeral 1 denotes the address input circuit, reference numeral 2 denotes the substitution requirement judging circuit, reference numeral 3 denotes a plurality of normal word line drivers, reference numeral 4 denotes a plurality of spare word line drivers, reference numeral 5 denotes a normal cell array, and reference numeral 6 denotes a spare cell array. MC in the normal cell array 5 is a normal memory cell of one transistor/one capacitor configuration, and SM in the spare cell array 6 is a spare memory cell of one transistor/one capacitor configuration. A plurality of normal word line drivers is shown in a form of one block for simplicity of drawing. However, the normal word line drivers are provided in correspondence to the normal word lines, respectively, though not shown. Similarly, a plurality of spare word line drivers is shown in a form of one block for simplicity of drawing. However, the spare word line drivers are provided in correspondence to the spare word lines, respectively, though not shown. The following description will be made with regard to one normal word line driver and one spare word line driver for simplicity of explanation.

The address input circuit 1 has a function of waveform-shaping an address signal inputted thereto and outputting a wave-shaped output address signal. The wave-shaped output address signal is supplied to not only the substitution requirement judging circuit 2 but also the normal word line driver 3 and the spare word line driver 4. In this embodiment, since row redundancy is carried out, the substitution requirement judging circuit 2 deals with a row address signal or a pre-decoded row address signal.

The substitution requirement judging circuit 2 stores an address (row address in this embodiment) for which the normal memory cell is to be substituted by the spare memory cell in, for example, fuse elements, compares an input address supplied from the address input circuit 1 with the address stored in the fuse elements (fuse data) to judge whether the substitution is required or not, and selects the normal word line driver 3 or the spare word line driver 4 according to the judgment result.

The drive output of the normal word line driver 3 is supplied to the corresponding normal word line WL connected to a normal memory cell of the normal cell array 5, and the drive output of the spare word line driver 4 is supplied to the corresponding spare word line SWL connected to a spare memory cell of the spare cell array 6.

That is, the drive outputs of the plurality of word line drivers 3 are supplied to the memory cell of the cell array 5 through the corresponding word lines WL. The drive outputs of the plurality of spare word line drivers 4 are supplied to the spare memory cell of the spare cell array 6 through the corresponding spare word lines SWL.

When the address signal is supplied to the normal word line driver 3 and the spare word line driver 4, the word line driver 3 and the spare word line driver 4 decode the address signal and start driving of the corresponding word line WL and the spare word line SWL, respectively. When the signal of the judgment result requiring the substitution is supplied from the substitution requirement judging circuit 2 to the normal word line driver 3 and the spare word line driver 4, then the normal word line driver 3 stops the drive of the normal word line WL, while the spare word line driver 4 continues the drive of the spare word line SWL. On the other hand, when the signal of the judgment result not requiring the substitution is supplied from the substitution requirement judging circuit 2 to the normal word line driver 3 and the spare word line driver 4, then the normal word line driver 3 continues the drive of the word line WL and the spare word line driver 4 stops the drive of the spare word lines SWL.

Two examples will be described hereinafter for the operation of driving the normal word line WL and the spare word line SWL.

FIG. 4 is a waveform chart showing a first example of the operation in the case where the spare word line SWL is selected in the FeRAM of the first embodiment of the present invention. The normal plate line PL connected to the normal memory cell is driven by a normal plate line driver (not shown), and a spare plate line SPL connected to the spare memory cell is driven by a spare plate line driver (not shown).

When the address signal is inputted to the address input circuit 1 at time t1, the output address signal of the address input circuit 1 is inputted to the word line driver 3 and the spare word line driver 4. Consequently, the normal word line driver 3 and the spare word line driver 4 drive the normal word line WL and the spare word line SWL, respectively, so that the normal word line WL starts to rise from the "L" level to the "H" level and the spare word line SWL starts to fall from the "L" level to the "H" level.

At time t5 at which the potentials of WL and SWL have risen to a certain level, the substitution requirement judging circuit 2 compares the input address with the address stored in the fuse element and judges (fuse-judges) that the substitution is required. That is, it is judged that the normal memory cell is substituted by the spare memory cell. As a result, the potential of the normal word line WL starts to fall (return) to the "L" level and the cell transistor whose gate is connected to this word line WL becomes an off-state. Since the potential of the normal plate line PL of the normal cell array 5 is fixed to the "L" level, read/write operation of the memory cell is not carried out.

On the other hand, the spare word line SWL continue to rise to the "H" level, the cell transistor whose gate is connected to this spare word line SWL becomes an on-state, and thus a ferroelectric capacitor 7 connected to this cell transistor is selected. After that, the spare plate line SPL is driven and the potential thereof rises to the "H" level. As a result, the read operation or the write operation is carried out.

Figure 25:
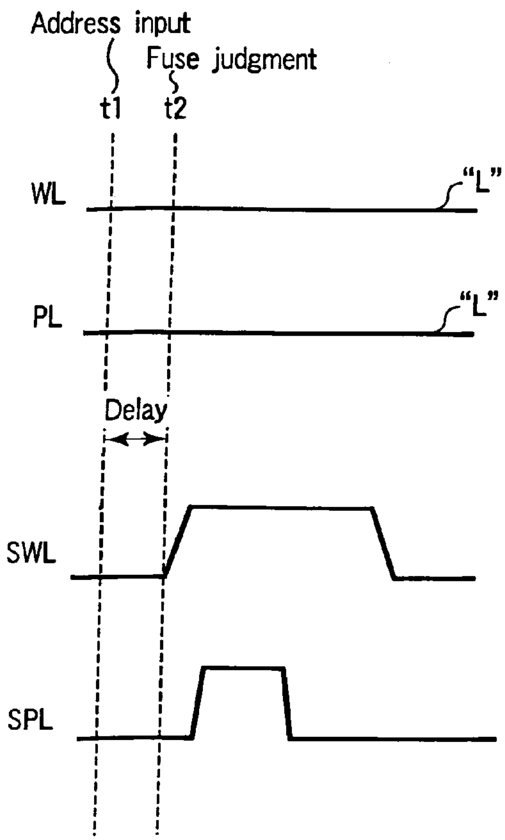
FIG. 25 is a waveform chart showing an operation example in the case where a spare word line SWL is selected by using the circuit of the word line selecting system of the conventional example shown in FIG. 24 in the array of FeRAM cells having the one transistor/one capacitor configuration, which is shown in FIG. 9.

As described above, according to this example, when the address signal is inputted to the address input circuit 1, the output address signal of the address input circuit 1 is inputted to the normal word line driver 3 and the spare word line driver 4, so that the normal word line WL and the spare word line SWL simultaneously start to rise to the "H" level. This operation differs from that of the conventional example described referring to FIG. 25.

After the operation, the normal word line driver 3 or the spare word line driver 4 is selected by the judgment result of the substitution requirement judging circuit 2. Hence, the operation in driving the normal word line WL or the spare word line SWL becomes faster and thus the access time can be shortened as compared with that of the conventional example.

In this case, even when the normal word line WL and the spare word line SWL simultaneously become the “H” level and thus the cell transistor 8 of the normal memory cell and the cell transistor 8 of the spare memory cell become the on-state (selected state), no potential difference is generated between both terminals of the selected ferroelectric capacitor 7, if the potential of the bit line BL and the potential of the normal plate line PL and spare plate line SPL are the same. Thus, a memory crush of the stored data does not occur.

FIG. 5 is a waveform chart showing a second example of the operation in the case where the spare word line SWL is selected in the FeRAM of the first embodiment of the present invention.

The second example shown in FIG. 5 is the same as the first example described referring to FIG. 4 in that the normal word line WL and the spare word line SWL are simultaneously start to rise to the “H” level when the address signal is inputted to the address input circuit 1 and the output address signal of the address input circuit 1 is inputted to the normal word line driver 3 and the spare word line driver 4, and the judgment is carried out by the substitution requirement judging circuit 2. However, the second example shown in FIG. 5 differs from the first example described referring to FIG. 4 in that the judgment is carried out at time t6 which is after the word line WL and the spare word line SWL become near the “H” level. According to this operation, the access time can be shortened, as compared with the operation of the conventional example described referring to FIG. 25. The time t6 may be a time which is after the word line WL and the spare word line SWL completely become the “H” level. The other operations are the same as the operation of the conventional example described referring to FIG. 25.

In the operation above-described, on condition that the potential of the word line of the non-selected memory cell is returned to the “L” level before the normal plate line PL or the spare plate line SPL are selected to become the “H” level, so that no potential difference is generated between the both terminals of the ferroelectric capacitor 7 of the non-elected memory cell, a possibility of malfunction will not be generated, even when the potentials of the normal word line WL and the spare word line SWL completely rise to the “H” level.

<Second Embodiment>

The configuration and operation will be described below as a second embodiment of the present invention, in which the FeRAM in FIG. 1 includes an array of the TC (transistor-capacitor) parallel unit series connection type ferroelectric memory cells, which has been described referring to FIG. 10.

FIG. 6 is a block diagram showing a part of the FeRAM of FIG. 1, which includes circuits associated with the word line selection and parts of the memory cell array and spare memory cell array.

That is, in FIG. 6, reference numeral 1 denotes the address input circuit, reference numeral 2 denotes the substitution requirement judging circuit, reference numeral 3*a* denotes a plurality of normal word line drivers, reference numeral 4*a* denotes a plurality of spare word line drivers, reference numeral 5*a* denotes a normal cell array, and reference numeral 6*a* denotes a spare cell array. MC in the normal cell array 5*a* is a normal memory cell of TC-parallel-unit series connection type, and SM in the spare cell array 6*a* is a spare memory cell of TC-parallel-unit series connection type. A plurality of normal word line drivers is shown in a form of one block for simplicity of drawing. However, the normal word line drivers are provided in correspondence to the normal word lines, respectively, though not shown. Similarly, a plurality of spare word line drivers are shown in a form of one block for simplicity of drawing. However, the spare word line drivers are provided in correspondence to the spare word lines, respectively, though not shown. The following description will be made with regard to one normal word line driver and one spare word line driver, for simplicity of explanation.

Like the circuit shown in FIG. 3, this circuit of FIG. 6 differs from the conventional circuit of the word line selecting system, which has been described referring to FIG. 24, in that output of the address input circuit 1 is directly supplied to the word line driver 3*a* and the spare word line driver 4*a*, besides being supplied to the substitution requirement judging circuit 2.

The address input circuit 1 has a function of waveform-shaping an address signal inputted thereto and outputting a wave-shaped output address signal. The wave-shaped output address signal is supplied to not only the substitution requirement judging circuit 2 but also the normal word line driver 3*a* and the spare word line driver 4*a*. Like the circuit shown in FIG. 3, in this embodiment, since row redundancy is carried out, the substitution requirement judging circuit 2 deals with a row address signal or a pre-decode row address signal.

The substitution requirement judging circuit 2 stores an address (row address in this embodiment) for which the normal memory cell is to be substituted by the spare memory cell in, for example, fuse elements, compares an input address supplied from the address input circuit 1 with the address stored in the fuse elements (fuse data) to judge whether the substitution is required or not, and selects the normal word line driver 3*a* or the spare word line driver 4*a* according to the judgment result.

The drive output of the normal word line driver 3*a* is supplied to the corresponding normal word line WL connected to a normal memory cell of the normal cell array 5*a*, and the drive output of the spare word line driver 4*a* is supplied to the corresponding spare word line SWL connected to a spare memory cell of the spare cell array 6*a*.

That is, the drive outputs of the plurality of word line drivers 3*a* are supplied to the memory cell of the cell array 5*a* through the corresponding word lines WL. The drive outputs of the plurality of spare word line drivers 4*a* are supplied to the spare memory cell of the spare cell array 6*a* through the corresponding spare word lines SWL.

When the address signal is supplied to the normal word line driver 3*a* and the spare word line driver 4*a*, the word line driver 3*a* and the spare word line driver 4*a* decode the address signal and start driving of the corresponding word line WL and the spare word line SWL, respectively. When the signal of the judgment result requiring the substitution is supplied from the substitution requirement judging circuit 2 to the normal word line driver 3*a* and the spare word line driver 4*a*, then the normal word line driver 3*a* stops the drive of the normal word line WL, while the spare word line driver 4*a* continues the drive of the spare word line SWL. On the other hand, when the signal of the judgment result not requiring the substitution is supplied from the substitution requirement judging circuit 2 to the normal word line driver 3*a* and the spare word line driver 4*a*, then the normal word line driver 3*a* continues the drive of the word line WL and the spare word line driver 4*a* stops the drive of the spare word lines SWL.

Two examples will be described hereinafter for the operation of driving the normal word line WL and the spare word line SWL.

Figure 7:
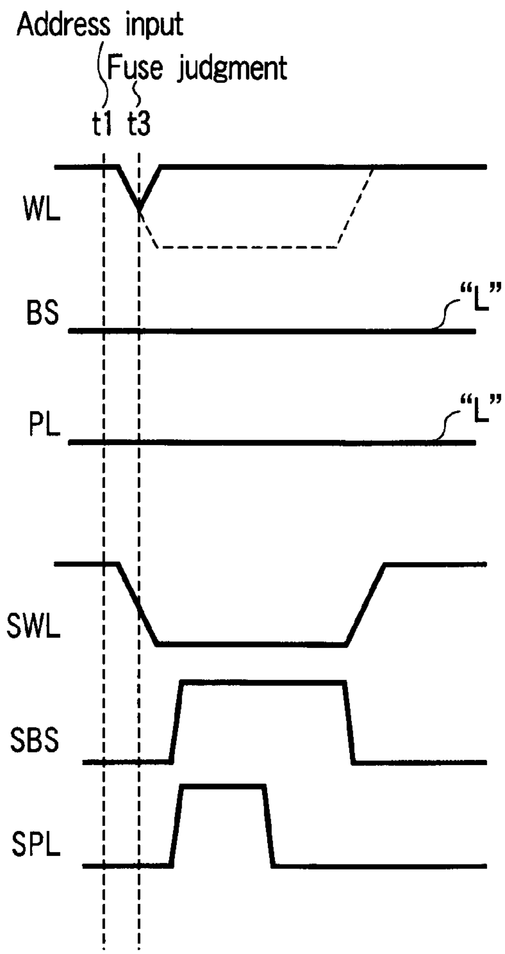
FIG. 7 is a waveform chart showing a first example of operation in the case where a spare word line SWL is selected in the FeRAM of the second embodiment of the present invention.

FIG. 7 is a waveform chart showing a first example of the operation in the case where the spare word line SWL is selected in the FeRAM of the second embodiment of the present invention. The normal plate line PL connected to the normal memory cell is driven by a normal plate line driver (not shown), and a spare plate line SPL connected to the spare memory cell is driven by a spare plate line driver (not shown).

When the address signal is inputted to the address input circuit 1 at time t1, the output address signal of the address input circuit 1 is inputted to the word line driver 3*a* and the spare word line driver 4*a*. Consequently, the normal word line driver 3*a* and the spare word line driver 4*a* drive the normal word line WL and the spare word line SWL, respectively, so that the normal word line WL starts to fall from the "H" level to the "L" level and the spare word line SWL starts to rise from the "H" level to the "L" level.

At time t3 at which the potentials of WL and SWL have fallen to a certain level, the substitution requirement judging circuit 2 compares the input address with the address stored in the fuse element and judges (fuse-judges) that the substitution is required. That is, it is judged that the normal memory cell is substituted by the spare memory cell. As a result, the potential of the normal word line WL starts to rise (return) to the "H" level and the cell transistor whose gate is connected to this word line WL becomes an on-state. Since the potential of the normal plate line PL of the normal cell array 5*a* is fixed to the "L" level, read/write operation of the memory cell is not carried out.

On the other hand, the spare word line SWL continues to fall to the "L" level, the cell transistor whose gate is connected to this spare word line SWL becomes an off-state, and thus a ferroelectric capacitor 7 connected to this cell transistor is selected. After that, the spare block selecting line SBS is driven and the potential thereof rises to the "H" level to connect the spare memory cell to the bit line BL, and further the spare plate line SPL is driven and the potential thereof rises to the "H" level. As a result, the read operation or the write operation is carried out.

Figure 26:
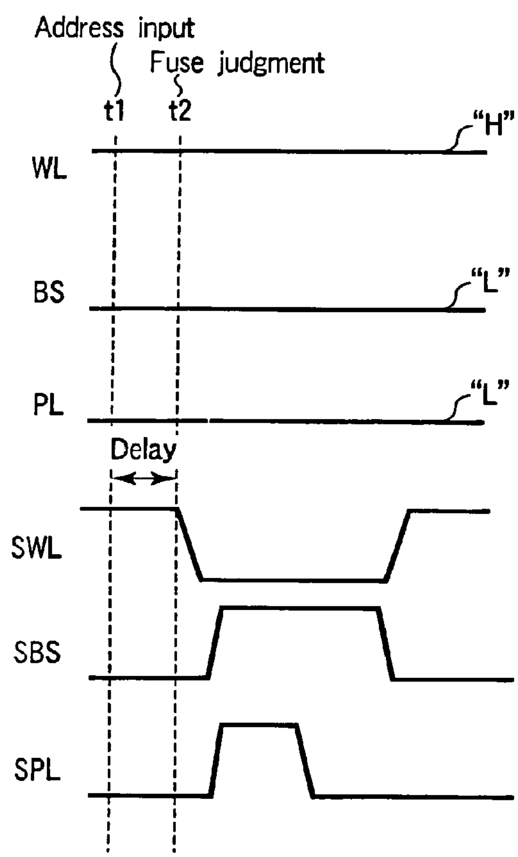
FIG. 26 is a waveform chart showing an operation example in the case where the spare word line SWL is selected by using the circuit of the word line selecting system of the conventional example shown in the FeRAM having the array of the TC-parallel-unit series connection type of ferroelectric memory cells shown in FIG. 10.

As described above, according to this example, when the address signal is inputted to the address input circuit 1, the output address signal of the address input circuit 1 is inputted to the normal word line driver 3*a* and the spare word line driver 4*a*, so that the normal word line WL and the spare word line SWL simultaneously start to fall to the "L" level. This operation differs from that of the conventional example described referring to FIG. 26.

After the operation in which the word line WL and the spare word line SWL are simultaneously set to the active state, the normal word line driver 3*a* or the spare word line driver 4*a* is selected by the judgment result of the substitution requirement judging circuit 2. Hence, the operation in driving the normal word line WL or the spare word line SWL becomes faster and thus the access time can be shortened as compared with that of the conventional example.

At this time, the normal block selecting line BS and spare block selecting line SBS are at the "L" level, and thus the normal block selecting transistor 9 and spare block selecting transistor 9 are turned off. Thus, the normal memory cell and spare memory cell are separated from the bit line BL.

Thus, in this case, even when the normal word line WL and the spare word line SWL simultaneously become the "L" level and thus the cell transistor 8 of the normal memory cell and the cell transistor 8 of the spare memory cell become the off-state (selected state), no potential difference is generated between both terminals of the selected ferroelectric capacitor 7. Thus, a memory crush of the stored data does not occur.

Note that the normal word line and spare word line start to drive by the normal word line driver and spare word line driver so that the potentials of the normal word line and spare word line change toward an activation level, and the driving of the normal word line caused by the normal word line driver is stopped and the driving of the spare word line caused by the spare word line driver is continued, before the potential of the normal word line and the spare word line reach the activation level.

Figure 8:
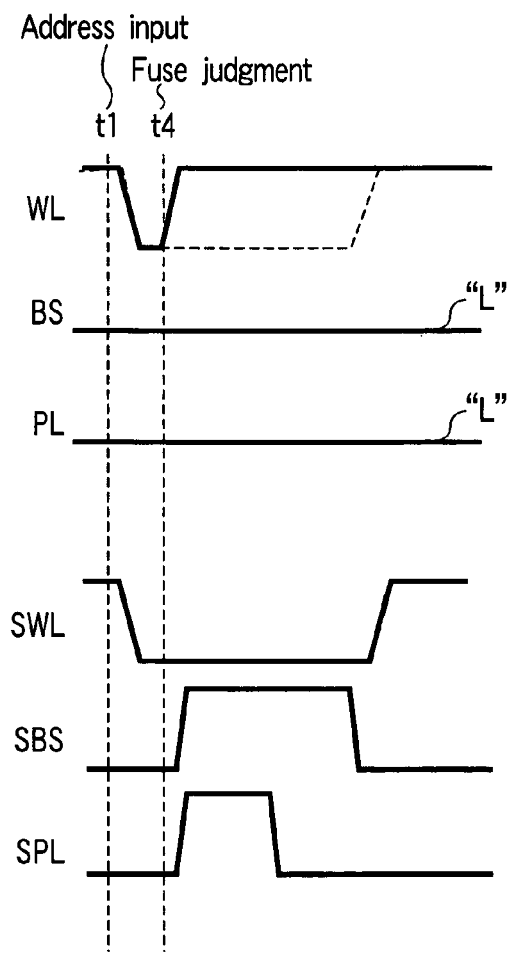
FIG. 8 is a waveform chart showing a second example of the operation in the case where the spare word line SWL is selected in the FeRAM of the second embodiment of the present invention.

FIG. 8 is a waveform chart showing a second example of the operation in the case where the spare word line SWL is selected in the FeRAM of the second embodiment of the present invention.

The second example shown in FIG. 8 is the same as the first example described referring to FIG. 7 in that the potentials of the normal word line WL and the spare word line SWL are simultaneously start to fall to the "L" level when the address signal is inputted to the address input circuit 1 and the output address signal of the address input circuit 1 is inputted to the normal word line driver 3*a* and the spare word line driver 4*a*, and the judgment is carried out by the substitution requirement judging circuit 2. However, the second example shown in FIG. 8 differs from the first example described referring to FIG. 7 in that the judgment is carried out at time t4 which is after the word line WL and the spare word line SWL become near the "L" level. According to this operation, the access time can be shortened, as compared with the operation of the conventional example described referring to FIG. 26. The time t4 may be a time which is after the word line WL and the spare word line SWL completely become the "L" level. The other operations are the same as the operation of the conventional example described referring to FIG. 25.

Note that the normal word line and spare word line start to drive by the normal word line driver and spare word line driver so that the potentials of the normal word line and spare word line change toward an activation level, and the driving of the normal word line caused by the normal word line driver is stopped and the driving of the spare word line caused by the spare word line driver is continued, after the potential of the normal word line and the spare word line reaches the activation level.

In the operation above-described, on condition that the potential of the word line of the non-selected memory cell is returned to the "H" level before the block selecting line BS or spare block selecting line SBS are selected to become the "H" level, so that no potential difference is generated between the both terminals of the ferroelectric capacitor 7 of the non-elected memory cell, a possibility of malfunction will not be generated, even when the potentials of the normal word line WL and the spare word line SWL completely fall to the "L" level.

Circuit examples of the normal word line driver 3 and the spare word line driver 4 in FIG. 3 referred to the description of the first embodiment and Circuit examples of the normal word line driver 3*a* and the spare word line driver 4*a* in FIG. 6 referred to the description of the second embodiment will be described below.

Figure 11A:
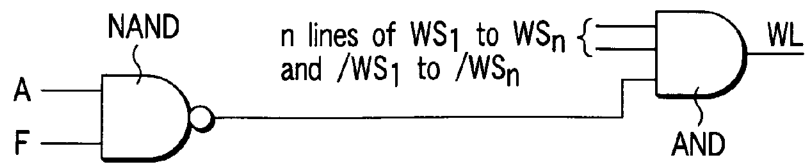
FIG. 11A is a circuit diagram showing a first example of a word line driver 3 in FIG. 3 for realizing the operation of FIG. 4.
Figure 12A:
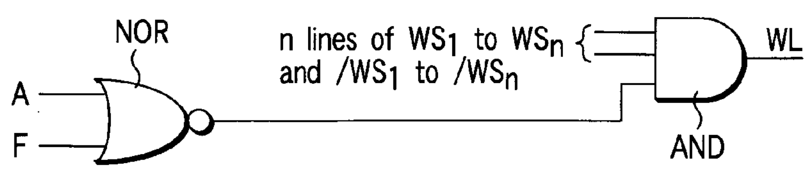
FIG. 12A is a circuit diagram showing a second example of the word line driver 3 in FIG. 3 for realizing the operation of FIG. 4.

FIG. 11A is a first example of a circuit diagram showing the word line driver 3 of the circuit shown in FIG. 3, which is used to realize the operation shown by the signal chart of FIG. 4. Since the circuit diagram of the spare word line driver 4 is the same as that of the normal word line driver circuit 3, only the normal word line driver 3 is shown in FIG. 12A for simplicity.

The word line driver shown in FIG. 11A includes a NAND circuit and an AND circuit. An output signal A of the address input circuit 1 and an output signal F of the fuse judging circuit 2 are inputted to the NAND circuit, and an output signal of the NAND circuit is inputted to the AND circuit. Besides the output signal of the NAND circuit, n signals of the complimentary word line driver selecting signals $WS_1$ to $WS_n$ and $/WS_1$ to $/WS_n$ (2n signals) are inputted to the AND circuit to drive the normal word line WL.

The word line driver is selected when all inputs of the n word line driver selecting signals become the "H" level, and the same logic value as that of the output of the NAND circuit is outputted from the AND circuit. Since a load against the AND circuit, which drives the word line WL is large, the rise and the fall of the output signal are delayed.

Figure 11B:
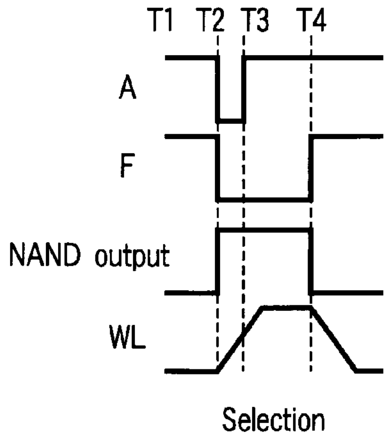
FIG. 11B is a timing waveform chart showing an operation example of a selected state of a word line by the word line driver of FIG. 11A.
Figure 11C:
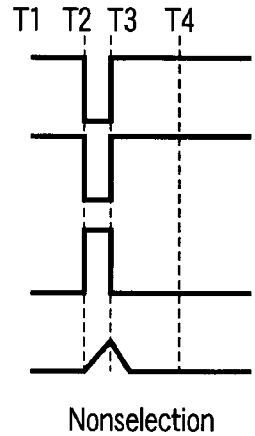
FIG. 11C is a timing waveform chart showing an operation example of a non-selected state of a word line by the word line driver of FIG. 11A.

FIG. 11B is a timing waveform chart (a waveform chart of the input and output signals and an internal signal) showing an example of the operation of the circuit of FIG. 11A controlled by the output signal F of the fuse judging circuit 2 after being driven by the output signal A (pulse signal) of the address input circuit 1 in the case where the circuit of FIG. 11A is selected. FIG. 11C is a timing waveform chart (a waveform chart of the input and output signals and the internal signal) showing an example of the operation of the circuit of FIG. 11A controlled by the output signal F of the fuse judging circuit 2 after being driven by the output signal A (pulse signal) of the address input circuit 1 in the case where the circuit of FIG. 11A is not selected.

During an interval of time T1 to T2, the output signal A of the address input circuit 1 is at the "H" level, the output signal F of the fuse judging circuit 2 is also at the "H" level, the output signal of the NAND circuit is at the "L" level, and the output signal of the word line driver is at the "L" level.

During an interval of time T2 to T3, the output signal A of the address input circuit 1 is at the "L" level, the output signal F of the fuse judging circuit 2 is also at the "L" level, the output signal of the NAND circuit is at the "H" level, and the output signal of the word line driver starts to become the "H" level.

During an interval of time T3 to T4, in the case where the circuit of FIG. 11A is selected, as shown in FIG. 11B, the output signal A of the address input circuit 1 is at the "H" level, the output signal F of the fuse judging circuit 2 is at the "L" level, the output signal of the NAND circuit is at the "H" level, the output signal of the word line driver is at the "H" level, and thus the word line WL becomes selected. On the other hand, in the case where the circuit of FIG. 11A is non-selected, as shown in FIG. 11C, the output signal A of the address input circuit 1 is at the "H" level, the output signal F of the fuse judging circuit 2 is also at the "H" level, the output signal of the NAND circuit is at the "L" level, the output signal of the word line driver is returned to the "L" level, and thus the word line WL becomes non-selected.

After time T4, the output signal A of the address input circuit 1 is at the "H" level, the output signal F of the fuse judging circuit 2 is also at the "H" level, the output signal of the NAND is at the "L" level, and thus the output signal of the word line is driver becomes the "L" level.

FIG. 12A is a second example of a circuit diagram showing the word line driver 3 of the circuit shown in FIG. 3, which is used to realize the operation shown by the signal chart of FIG. 4. Since the circuit diagram of the spare word line driver 4 is the same as that of the normal word line driver circuit 3, only the normal word line driver 3 is shown in FIG. 12A for simplicity.

The circuit shown in FIG. 12A differs from the circuit shown in FIG. 11A in that a NOR circuit is used instead of the NAND circuit, and the other parts or portions are the same.

That is, the word line driver shown in FIG. 12A includes a NOR circuit and an AND circuit. An output signal A of the address input circuit 1 and an output signal F of the fuse judging circuit 2 are inputted to the NOR circuit, and an output signal of the NOR circuit is inputted to the AND circuit. Besides the output signal of the NOR circuit, n signals of the complimentary word line driver selecting signals $WS_1$ to $WS_n$ and $/WS_1$ to $/WS_n$ (2n signals) are inputted to the AND circuit.

The word line driver is selected when all inputs of the n word line driver selecting signals become the "H" level, and the same logic value as that of the output of the NOR circuit is outputted from the AND circuit.

Figure 12B:
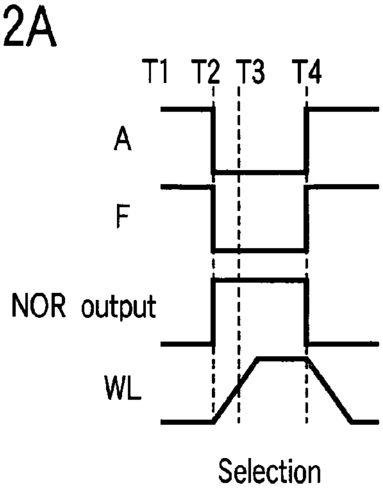
FIG. 12B is a timing waveform chart showing an operation example of a selected state of a word line by the word line driver of FIG. 12A.
Figure 12C:
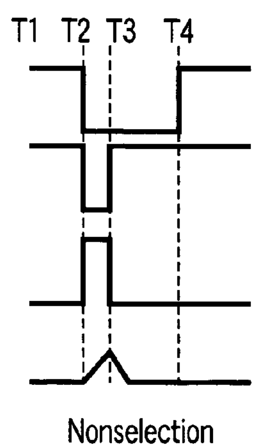
FIG. 12C is a timing waveform chart showing an operation example of a non-selected state of a word line by the word line driver of FIG. 12A.

FIG. 12B is a timing waveform chart (a waveform chart of the input and output signals and an internal signal) showing an example of the operation of the circuit of FIG. 12A controlled by the output signal F of the fuse judging circuit 2 after being driven by the output signal A (pulse signal) of the address input circuit 1 in the case where the circuit of FIG. 12A is selected. FIG. 12C is a timing waveform chart (a waveform chart of the input and output signals and the internal signal) showing an example of the operation of the circuit of FIG. 12A controlled by the output signal F of the fuse judging circuit 2 after being driven by the output signal A (pulse signal) of the address input circuit 1 in the case where the circuit of FIG. 12A is not selected.

During an interval of time T1 to T2, the output signal A of the address input circuit 1 is at the "H" level, the output signal F of the fuse judging circuit 2 is also at the "H" level, the output signal of the NOR circuit is at the "L" level, and the output signal of the word line driver is at the "L" level.

During an interval of time T2 to T3, the output signal A of the address input circuit 1 is at the "L" level, the output signal F of the fuse judging circuit 2 is also at the "L" level, the output signal of the NOR circuit is at the "H" level, and the output signal of the word line driver starts to become the "H" level.

During an interval of time T3 to T4, in the case where the circuit of FIG. 12A is selected, as shown in FIG. 12B, the output signal A of the address input circuit 1 is at the "L" level, the output signal F of the fuse judging circuit 2 is at the "L" level, the output signal of the NOR circuit is at the "H" level, the output signal of the word line driver is at the "H" level, and thus the word line WL becomes selected. On the other hand, in the case where the circuit of FIG. 12A is non-selected, as shown in FIG. 12C, the output signal A of the address input circuit 1 is at the "L" level, the output signal F of the fuse judging circuit 2 is at the "H" level, the output signal of the NOR circuit is at the "L" level, the output signal of the word line driver is returned to the "L" level, and thus the word line WL becomes non-selected.

After time T4, the output signal A of the address input circuit 1 is at the "H" level, the output signal F of the fuse judging circuit 2 is also at the "H" level, the output signal of the NOR is at the "L" level, and thus the output signal of the word line driver becomes the "L" level.

Figure 13A:
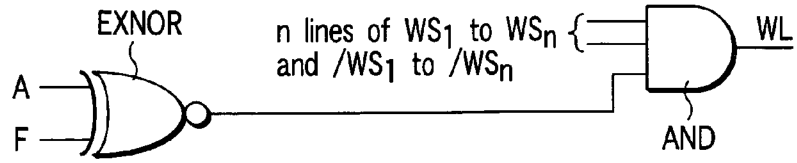
FIG. 13A is a circuit diagram showing a third example of the word line driver 3 in FIG. 3 for realizing the operation of FIG. 4.

FIG. 13A is a third example of a circuit diagram showing the word line driver 3 of the circuit shown in FIG. 3, which is used to realize the operation shown by the signal chart of FIG. 4. Since the circuit diagram of the spare word line driver 4 is the same as that of the normal word line driver circuit 3, only the normal word line driver 3 is shown in FIG. 13A for simplicity.

The circuit shown in FIG. 13A differs from the circuit shown in FIG. 11A in that an EXNOR (exclusive NOR) circuit is used at the input stage instead of the NAND circuit, and the other parts or portions are the same.

That is, the word line driver shown in FIG. 13A includes an EXNOR circuit and an AND circuit. An output signal A of the address input circuit 1 and an output signal F of the fuse judging circuit 2 are inputted to the EXNOR circuit, and an output signal of the EXNOR circuit is inputted to the AND circuit. Besides the output signal of the EXNOR circuit, n signals of the complimentary word line driver selecting signals $WS_1$ to $WS_n$ and $/WS_1$ to $/WS_n$ (2n signals) are inputted to the AND circuit.

The word line driver is selected when all inputs of the n word line driver selecting signals become the "H" level, and the same logic value as that of the output of the EXNOR circuit is outputted from the AND circuit.

Figure 13B:
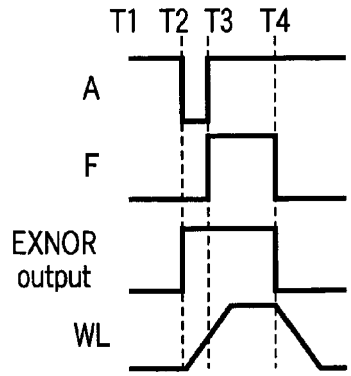
FIG. 13B is a timing waveform chart showing an operation example of a selected state of a word line by the word line driver of FIG. 13A.
Figure 13C:
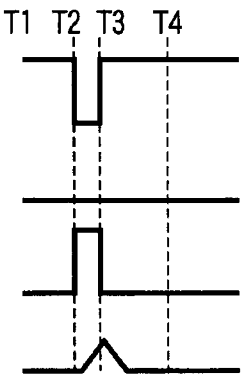
FIG. 13C is a timing waveform chart showing an operation example of a non-selected state of a word line by the word line driver of FIG. 13A.

FIG. 13B is a timing waveform chart (a waveform chart of the input and output signals and an internal signal) showing an example of the operation of the circuit of FIG. 13A controlled by the output signal F of the fuse judging circuit 2 after being driven by the output signal A (pulse signal) of the address input circuit 1 in the case where the circuit of FIG. 13A is selected. FIG. 13C is a timing waveform chart (a waveform chart of the input and output signals and the internal signal) showing an example of the operation of the circuit of FIG. 13A controlled by the output signal F of the fuse judging circuit 2 after being driven by the output signal A (pulse signal) of the address input circuit 1 in the case where the circuit of FIG. 13A is not selected.

During an interval of time T1 to T2, the output signal A of the address input circuit 1 is at the "H" level, the output signal F of the fuse judging circuit 2 is also at the "H" level, the output signal of the EXNOR circuit is at the "L" level, and the output signal of the word line driver is at the "L" level.

During an interval of time T2 to T3, the output signal A of the address input circuit 1 is at the "L" level, the output signal F of the fuse judging circuit 2 is also at the "L" level, the output signal of the EXNOR circuit is at the "H" level, and the output signal of the word line driver starts to become the "H" level.

During an interval of time T3 to T4, in the case where the circuit of FIG. 13A is selected, as shown in FIG. 13B, the output signal A of the address input circuit 1 is at the "H" level, the output signal F of the fuse judging circuit 2 is at the "H" level, the output signal of the EXNOR circuit is at the "H" level, the output signal of the word line driver is at the "H" level, and thus the word line WL becomes selected. On the other hand, in the case where the circuit of FIG. 13A is non-selected, as shown in FIG. 13C, the output signal A of the address input circuit 1 is at the "H" level, the output signal F of the fuse judging circuit 2 is at the "L" level, the output signal of the EXNOR circuit is at the "L" level, the output signal of the word line driver is returned to the "L" level, and thus the word line WL becomes non-selected.

After time T4, the output signal A of the address input circuit 1 is at the "H" level, the output signal F of the fuse judging circuit 2 is also at the "L" level, the output signal of the EXNOR is at the "L" level, and thus the output signal of the word line driver becomes the "L" level.

Figure 14A:
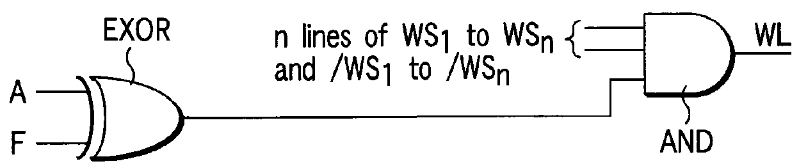
FIG. 14A is a circuit diagram showing a fourth example of the word line driver 3 in FIG. 3 for realizing the operation of FIG. 4.

FIG. 14A is a fourth example of a circuit diagram showing the word line driver 3 of the circuit shown in FIG. 3, which is used to realize the operation shown by the signal chart of FIG. 4. Since the circuit diagram of the spare word line driver 4 is the same as that of the normal word line driver circuit 3, only the normal word line driver 3 is shown in FIG. 14A for simplicity.

The circuit shown in FIG. 14A differs from the circuit shown in FIG. 11A in that an EXOR circuit is used at the input stage instead of the NAND circuit, and the other parts or portions are the same.

That is, the word line driver shown in FIG. 14A includes an EXOR circuit and an AND circuit. An output signal A of the address input circuit 1 and an output signal F of the fuse judging circuit 2 are inputted to the EXOR circuit, and an output signal of the EXOR circuit is inputted to the AND circuit. Besides the output signal of the EXOR circuit, n signals of the complimentary word line driver selecting signals $WS_1$ to $WS_n$ and $/WS_1$ to $/WS_n$ (2n signals) are inputted to the AND circuit.

The word line driver is selected when all inputs of the n word line driver selecting signals become the "H" level, and the same logic value as that of the output of the EXOR circuit is outputted from the AND circuit.

Figure 14B:
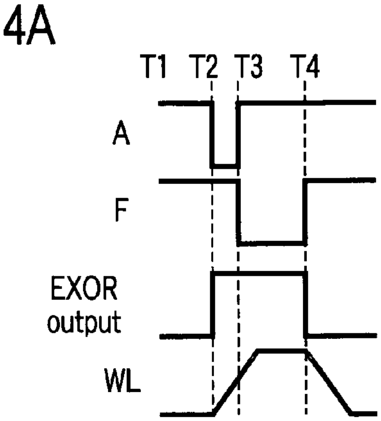
FIG. 14B is a timing waveform chart showing an operation example of a selected state of a word line by the word line driver of FIG. 14A.
Figure 14C:
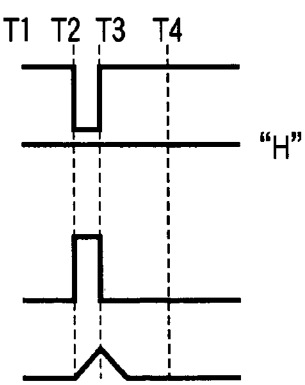
FIG. 14C is a timing waveform chart showing an operation example of a non-selected state of a word line by the word line driver of FIG. 14A.

FIG. 14B is a timing waveform chart (a waveform chart of the input and output signals and an internal signal) showing an example of the operation of the circuit of FIG. 14A controlled by the output signal F of the fuse judging circuit 2 after being driven by the output signal A (pulse signal) of the address input circuit 1 in the case where the circuit of FIG. 14A is selected. FIG. 14C is a timing waveform chart (a waveform chart of the input and output signals and the internal signal) showing an example of the operation of the circuit of FIG. 14A controlled by the output signal F of the fuse judging circuit 2 after being driven by the output signal A (pulse signal) of the address input circuit 1 in the case where the circuit of FIG. 14A is not selected.

During an interval of time T1 to T2, the output signal A of the address input circuit 1 is at the "H" level, the output signal F of the fuse judging circuit 2 is also at the "H" level, the output signal of the EXOR circuit is at the "L" level, and the output signal of the word line driver is at the "L" level.

During an interval of time T2 to T3, the output signal A of the address input circuit 1 is at the "L" level, the output signal F of the fuse judging circuit 2 is at the "H" level, the output signal of the EXOR circuit is at the "H" level, and the output signal of the word line driver starts to become the "H" level.

During an interval of time T3 to T4, in the case where the circuit of FIG. 14A is selected, as shown in FIG. 14B, the output signal A of the address input circuit 1 is at the "H" level, the output signal F of the fuse judging circuit 2 is at the "L" level, the output signal of the EXOR circuit is at the "H" level, the output signal of the word line driver is at the "H" level, and thus the word line WL becomes selected. On the other hand, in the case where the circuit of FIG. 14A is non-selected, as shown in FIG. 14C, the output signal A of the address input circuit 1 is at the "H" level, the output signal F of the fuse judging circuit 2 is at the "H" level, the output signal of the EXOR circuit is at the "L" level, the output signal of the word line driver is returned to the "L" level, and thus the word line WL becomes non-selected.

After time T4, the output signal A of the address input circuit 1 is at the "H" level, the output signal F of the fuse judging circuit 2 is also at the "H" level, the output signal of the EXOR is at the "L" level, and thus the output signal of the word line driver becomes the "L" level.

Figure 15A:
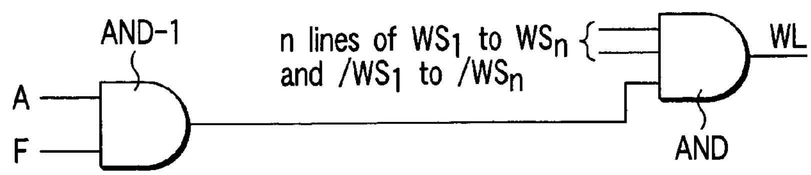
FIG. 15A is a circuit diagram showing a fifth example of the word line driver 3 in FIG. 3 for realizing the operation of FIG. 4.

FIG. 15A is a fifth example of a circuit diagram showing the word line driver 3 of the circuit shown in FIG. 3, which is used to realize the operation shown by the signal chart of FIG. 4. Since the circuit diagram of the spare word line driver 4 is the same as that of the normal word line driver circuit 3, only the normal word line driver 3 is shown in FIG. 15A for simplicity.

The circuit shown in FIG. 15A differs from the circuit shown in FIG. 11A in that an AND circuit is used instead of the NAND circuit, and the other parts or portions are the same.

That is, the word line driver shown in FIG. 15A includes an AND circuit at the input stage and an AND circuit at the output stage. An output signal A of the address input circuit 1 and an output signal F of the fuse judging circuit 2 are inputted to the input stage AND circuit, and an output signal of the input stage AND circuit is inputted to the output stage AND circuit. Besides the output signal of the input stage AND circuit, n signals of the complimentary word line driver selecting signals $WS_1$ to $WS_n$ and $/WS_1$ to $/WS_n$ (2n signals) are inputted to the output stage AND circuit.

The word line driver is selected when all inputs of the n word line driver selecting signals become the "H" level, and the same logic value as that of the output of the input stage AND circuit is outputted from the output stage AND circuit.

Figures 15B, 15C:
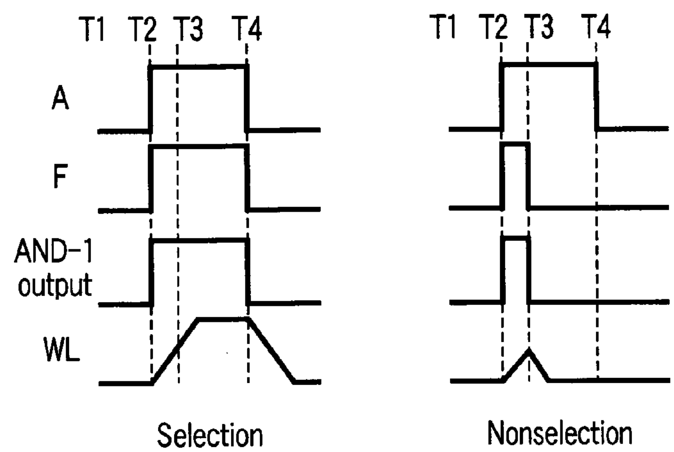
FIG. 15B is a timing waveform chart showing an operation example of a selected state of a word line by the word line driver of FIG. 15A.
FIG. 15C is a timing waveform chart showing an operation example of a non-selected state of a word line by the word line driver of FIG. 1SA.

FIG. 15B is a timing waveform chart (a waveform chart of the input and output signals and an internal signal) showing an example of the operation of the circuit of FIG. 15A controlled by the output signal F of the fuse judging circuit 2 after being driven by the output signal A (pulse signal) of the address input circuit 1 in the case where the circuit of FIG. 15A is selected. FIG. 15C is a timing waveform chart (a waveform chart of the input and output signals and the internal signal) showing an example of the operation of the circuit of FIG. 15A controlled by the output signal F of the fuse judging circuit 2 after being driven by the output signal A (pulse signal) of the address input circuit 1 in the case where the circuit of FIG. 15A is not selected.

During an interval of time T1 to T2, the output signal A of the address input circuit 1 is at the "L" level, the output signal F of the fuse judging circuit 2 is also at the "L" level, the output signal of the input stage AND circuit is at the "L" level, and the output signal of the word line driver is at the "L" level.

During an interval of time T2 to T3, the output signal A of the address input circuit 1 is at the "H" level, the output signal F of the fuse judging circuit 2 is also at the "H" level, the output signal of the input stage AND circuit is at the "H" level, and the output signal of the word line driver starts to become the "H" level.

During an interval of time T3 to T4, in the case where the circuit of FIG. 15A is selected, as shown in FIG. 15B, the output signal A of the address input circuit 1 is at the "H" level, the output signal F of the fuse judging circuit 2 is at the "H" level, the output signal of the input stage AND circuit is at the "H" level, the output signal of the word line driver is at the "H" level, and thus the word line WL becomes selected. On the other hand, in the case where the circuit of FIG. 15A is non-selected, as shown in FIG. 15C, the output signal A of the address input circuit 1 is at the "H" level, the output signal F of the fuse judging circuit 2 is at the "L" level, the output signal of the input stage AND circuit is at the "L" level, the output signal of the word line driver is returned to the "L" level, and thus the word line WL becomes non-selected.

After time T4, the output signal A of the address input circuit 1 is at the "L" level, the output signal F of the fuse judging circuit 2 is also at the "L" level, the output signal of the input stage AND is at the "L" level, and thus the output signal of the word line driver becomes the "L" level.

Figure 16A:
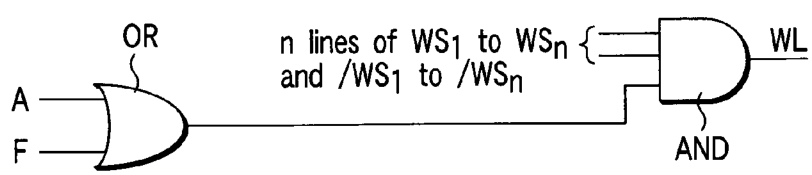
FIG. 16A is a circuit diagram showing a sixth example of the word line driver 3 in FIG. 3 for realizing the operation of FIG. 4.

FIG. 16A is a sixth example of a circuit diagram showing the word line driver 3 of the circuit shown in FIG. 3, which is used to realize the operation shown by the signal chart of FIG. 4. Since the circuit diagram of the spare word line driver 4 is the same as that of the normal word line driver circuit 3, only the normal word line driver 3 is shown in FIG. 16A for simplicity.

The circuit shown in FIG. 16A differs from the circuit shown in FIG. 11A in that an OR (logical sum) circuit is used instead of the NAND circuit, and the other parts or portions are the same.

That is, the word line driver shown in FIG. 16A includes an OR circuit and an AND circuit. An output signal A of the address input circuit 1 and an output signal F of the fuse judging circuit 2 are inputted to the OR circuit, and an output signal of the OR circuit is inputted to the AND circuit. Besides the output signal of the OR circuit, n signals of the complimentary word line driver selecting signals $WS_1$ to $WS_n$ and $/WS_1$ to $/WS_n$ (2n signals) are inputted to the AND circuit.

The word line driver is selected when all inputs of the n word line driver selecting signals become the "H" level, and the same logic value as that of the output of the OR circuit is outputted from the AND circuit.

Figures 16B, 16C:
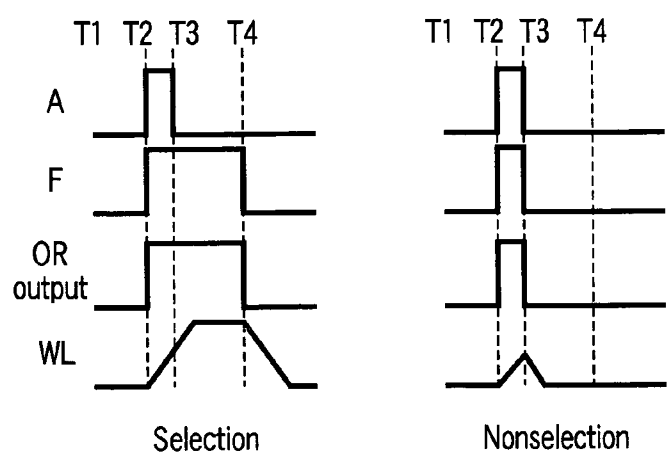
FIG. 16B is a timing waveform chart showing an operation example of a selected state of a word line by the word line driver of FIG. 16A.
FIG. 16C is a timing waveform chart showing an operation example of a non-selected state of a word line by the word line driver of FIG. 16A.

FIG. 16B is a timing waveform chart (a waveform chart of the input and output signals and an internal signal) showing an example of the operation of the circuit of FIG. 16A controlled by the output signal F of the fuse judging circuit 2 after being driven by the output signal A (pulse signal) of the address input circuit 1 in the case where the circuit of FIG. 16A is selected. FIG. 16C is a timing waveform chart (a waveform chart of the input and output signals and the internal signal) showing an example of the operation of the circuit of FIG. 16A controlled by the output signal F of the fuse judging circuit 2 after being driven by the output signal A (pulse signal) of the address input circuit 1 in the case where the circuit of FIG. 16A is not selected.

During an interval of time T1 to T2, the output signal A of the address input circuit 1 is at the "L" level, the output signal F of the fuse judging circuit 2 is also at the "L" level, the output signal of the OR circuit is at the "L" level, and the output signal of the word line driver is at the "L" level.

During an interval of time T2 to T3, the output signal A of the address input circuit 1 is at the "H" level, the output signal F of the fuse judging circuit 2 is also at the "H" level, the output signal of the OR circuit is at the "H" level, and the output signal of the word line driver starts to become the "H" level.

During an interval of time T3 to T4, in the case where the circuit of FIG. 16A is selected, as shown in FIG. 16B, the output signal A of the address input circuit 1 is at the "L" level, the output signal F of the fuse judging circuit 2 is at the "H" level, the output signal of the OR circuit is at the "H" level, the output signal of the word line driver is at the "H" level, and thus the word line WL becomes selected. On the other hand, in the case where the circuit of FIG. 16A is non-selected, as shown in FIG. 16C, the output signal A of the address input circuit 1 is at the "L" level, the output signal F of the fuse judging circuit 2 is at the "L" level, the output signal of the OR circuit is at the "L" level, the output signal of the word line driver is returned to the "L" level, and thus the word line WL becomes non-selected.

After time T4, the output signal A of the address input circuit 1 is at the "L" level, the output signal F of the fuse judging circuit 2 is also at the "L" level, the output signal of the OR is at the "L" level, and thus the output signal of the word line driver becomes the "L" level.

FIG. 17A is a first example of a circuit diagram showing the word line driver 3 of the circuit shown in FIG. 6, which is used to realize the operation shown by the signal chart of FIG. 7. Since the circuit diagram of the spare word line driver 4 is the same as that of the normal word line driver circuit 3, only the normal word line driver 3 is shown in FIG. 17A for simplicity.

The word line driver shown in FIG. 17A includes a NAND circuit at the input stage and a NAND circuit at the output stage. An output signal A of the address input circuit 1 and an output signal F of the fuse judging circuit 2 are inputted to the input stage NAND circuit, and an output signal of the input stage NAND circuit is inputted to the output stage NAND circuit. Besides the output signal of the input stage NAND circuit, n signals of the complimentary word line driver selecting signals $WS_1$ to $WS_n$ and $/WS_1$ to $/WS_n$ (2n signals) are inputted to the output stage NAND circuit.

The word line driver is selected when all inputs of the n word line driver selecting signals become the "H" level, and an inverted logic signal of that of the output signal of the input stage NAND circuit is outputted from the output stage NAND circuit. Since a load against the output stage NAND circuit, which drives the word line WL, is large, the rise and the fall of the output signal are delayed.

FIG. 17B is a timing waveform chart (a waveform chart of the input and output signals and an internal signal) showing an example of the operation of the circuit of FIG. 17A controlled by the output signal F of the fuse judging circuit 2 after being driven by the output signal A (pulse signal) of the address input circuit 1 in the case where the circuit of FIG. 17A is selected. FIG. 17C is a timing waveform chart (a waveform chart of the input and output signals and the internal signal) showing an example of the operation of the circuit of FIG. 17A controlled by the output signal F of the fuse judging circuit 2 after being driven by the output signal A (pulse signal) of the address input circuit 1 in the case where the circuit of FIG. 17A is not selected.

During an interval of time T1 to T2, the output signal A of the address input circuit 1 is at the "H" level, the output signal F of the fuse judging circuit 2 is also at the "H" level, the output signal of the input stage NAND circuit is at the "L" level, and the output signal of the word line driver is at the "H" level.

During an interval of time T2 to T3, the output signal A of the address input circuit 1 is at the "L" level, the output signal F of the fuse judging circuit 2 is also at the "L" level, the output signal of the input stage NAND circuit is at the "H" level, and the output signal of the word line driver starts to become the "L" level.

During an interval of time T3 to T4, in the case where the circuit of FIG. 17A is selected, as shown in FIG. 17B, the output signal A of the address input circuit 1 is at the "H" level, the output signal F of the fuse judging circuit 2 is at the "H" level, the output signal of the input stage NAND circuit is at the "H" level, the output signal of the word line driver is at the "L" level, and thus the word line WL becomes selected. On the other hand, in the case where the circuit of FIG. 17A is non-selected, as shown in FIG. 17C, the output signal A of the address input circuit 1 is at the "H" level, the output signal F of the fuse judging circuit 2 is at the "H" level, the output signal of the input stage NAND circuit is at the "H" level, the output signal of the word line driver is returned to the "H" level, and thus the word line WL becomes non-selected.

After time T4, the output signal A of the address input circuit 1 is at the "H" level, the output signal F of the fuse judging circuit 2 is also at the "H" level, the output signal of the input stage NAND is at the "L" level, and thus the output signal of the word line driver becomes the "H" level.

FIG. 18A is a second example of a circuit diagram showing the word line driver 3 of the circuit shown in FIG. 6, which is used to realize the operation shown by the signal chart of FIG. 7. Since the circuit diagram of the spare word line driver 4 is the same as that of the normal word line driver circuit 3, only the normal word line driver 3 is shown in FIG. 18A for simplicity.

The circuit shown in FIG. 18A differs from the circuit shown in FIG. 17A in that a NOR circuit is used instead of the input stage NAND circuit, and the other parts or portions are the same.

That is, the word line driver shown in FIG. 18A includes a NOR circuit and a NAND circuit. An output signal A of the address input circuit 1 and an output signal F of the fuse judging circuit 2 are inputted to the NOR circuit, and an output signal of the NOR circuit is inputted to the NAND circuit. Besides the output signal of the NOR circuit, n signals of the complimentary word line driver selecting signals $WS_1$ to $WS_n$ and $/WS_1$ to $/WS_n$ (2n signals) are inputted to the NAND circuit.

The word line driver is selected when all inputs of the n word line driver selecting signals become the "H" level, and an inverted logic signal of that of the output signal of the NOR circuit is outputted from the NAND circuit.

FIG. 18B is a timing waveform chart (a waveform chart of the input and output signals and an internal signal) showing an example of the operation of the circuit of FIG. 18A controlled by the output signal F of the fuse judging circuit 2 after being driven by the output signal A (pulse signal) of the address input circuit 1 in the case where the circuit of FIG. 18A is selected. FIG. 18C is a timing waveform chart (a waveform chart of the input and output signals and the internal signal) showing an example of the operation of the circuit of FIG. 18A controlled by the output signal F of the fuse judging circuit 2 after being driven by the output signal A (pulse signal) of the address input circuit 1 in the case where the circuit of FIG. 18A is not selected.

During an interval of time T1 to T2, the output signal A of the address input circuit 1 is at the "H" level, the output signal F of the fuse judging circuit 2 is also at the "H" level, the output signal of the NOR circuit is at the "L" level, and the output signal of the word line driver is at the "H" level.

During an interval of time T2 to T3, the output signal A of the address input circuit 1 is at the "L" level, the output signal F of the fuse judging circuit 2 is also at the "L" level, the output signal of the NOR circuit is at the "H" level, and the output signal of the word line driver starts to become the "L" level.

During an interval of time T3 to T4, in the case where the circuit of FIG. 18A is selected, as shown in FIG. 18B, the output signal A of the address input circuit 1 is at the "L" level, the output signal F of the fuse judging circuit 2 is at the "L" level, the output signal of the NOR circuit is at the "H" level, the output signal of the word line driver is at the "L" level, and thus the word line WL becomes selected. On the other hand, in the case where the circuit of FIG. 18A is non-selected, as shown in FIG. 18C, the output signal A of the address input circuit 1 is at the "L" level, the output signal F of the fuse judging circuit 2 is at the "H" level, the output signal of the NOR circuit is at the “L” level, the output signal of the word line driver is returned to the “H” level, and thus the word line WL becomes non-selected.

After time T4, the output signal A of the address input circuit 1 is at the “H” level, the output signal F of the fuse judging circuit 2 is also at the “H” level, the output signal of the NOR is at the “L” level, and thus the output signal of the word line driver becomes the “H” level.

FIG. 19A is a third example of a circuit diagram showing the word line driver 3 of the circuit shown in FIG. 6, which is used to realize the operation shown by the signal chart of FIG. 7. Since the circuit diagram of the spare word line driver 4 is the same as that of the normal word line driver circuit 3, only the normal word line driver 3 is shown in FIG. 19A for simplicity.

The circuit shown in FIG. 19A differs from the circuit shown in FIG. 17A in that an EXNOR (exclusive NOR) circuit is used at the input stage instead of the NAND circuit, and the other parts or portions are the same.

That is, the word line driver shown in FIG. 19A includes an EXNOR circuit and a NAND circuit. An output signal A of the address input circuit 1 and an output signal F of the fuse judging circuit 2 are inputted to the EXNOR circuit, and an output signal of the EXNOR circuit is inputted to the NAND circuit. Besides the output signal of the EXNOR circuit, n signals of the complimentary word line driver selecting signals $WS_1$ to $WS_n$ and $/WS_1$ to $/WS_n$ (2n signals) are inputted to the NAND circuit.

The word line driver is selected when all inputs of the n word line driver selecting signals become the “H” level, and an inverted logic signal of that of the output signal of the EXNOR circuit is outputted from the NAND circuit.

FIG. 19B is a timing waveform chart (a waveform chart of the input and output signals and an internal signal) showing an example of the operation of the circuit of FIG. 19A controlled by the output signal F of the fuse judging circuit 2 after being driven by the output signal A (pulse signal) of the address input circuit 1 in the case where the circuit of FIG. 19A is selected. FIG. 19C is a timing waveform chart (a waveform chart of the input and output signals and the internal signal) showing an example of the operation of the circuit of FIG. 19A controlled by the output signal F of the fuse judging circuit 2 after being driven by the output signal A (pulse signal) of the address input circuit 1 in the case where the circuit of FIG. 19A is not selected.

During an interval of time T1 to T2, the output signal A of the address input circuit 1 is at the “H” level, the output signal F of the fuse judging circuit 2 is at the “L” level, the output signal of the EXNOR circuit is at the “L” level, and the output signal of the word line driver is at the “H” level.

During an interval of time T2 to T3, the output signal A of the address input circuit 1 is at the “L” level, the output signal F of the fuse judging circuit 2 is also at the “L” level, the output signal of the EXNOR circuit is at the “H” level, and the output signal of the word line driver starts to become the “L” level.

During an interval of time T3 to T4, in the case where the circuit of FIG. 19A is selected, as shown in FIG. 19B, the output signal A of the address input circuit 1 is at the “H” level, the output signal F of the fuse judging circuit 2 is at the “H” level, the output signal of the EXNOR circuit is at the “H” level, the output signal of the word line driver is at the “L” level, and thus the word line WL becomes selected. On the other hand, in the case where the circuit of FIG. 19A is non-selected, as shown in FIG. 19C, the output signal A of the address input circuit 1 is at the “H” level, the output signal F of the fuse judging circuit 2 is at the “L” level, the output signal of the EXNOR circuit is at the “L” level, the output signal of the word line driver is returned to the “H” level, and thus the word line WL becomes non-selected.

After time T4, the output signal A of the address input circuit 1 is at the “H” level, the output signal F of the fuse judging circuit 2 is also at the “L” level, the output signal of the EXNOR is at the “L” level, and thus the output signal of the word line driver becomes the “H” level.

FIG. 20A is a fourth example of a circuit diagram showing the word line driver 3 of the circuit shown in FIG. 6, which is used to realize the operation shown by the signal chart of FIG. 7. Since the circuit diagram of the spare word line driver 4 is the same as that of the normal word line driver circuit 3, only the normal word line driver 3 is shown in FIG. 20A for simplicity.

The circuit shown in FIG. 20A differs from the circuit shown in FIG. 17A in that an EXOR circuit is used at the input stage instead of the NAND circuit, and the other parts or portions are the same.

That is, the word line driver shown in FIG. 20A includes an EXOR circuit and a NAND circuit. An output signal A of the address input circuit 1 and an output signal F of the fuse judging circuit 2 are inputted to the EXOR circuit, and an output signal of the EXOR circuit is inputted to the NAND circuit. Besides the output signal of the EXOR circuit, n signals of the complimentary word line driver selecting signals $WS_1$ to $WS_n$ and $/WS_1$ to $/WS_n$ (2n signals) are inputted to the NAND circuit.

The word line driver is selected when all inputs of the n word line driver selecting signals become the “H” level, and an inverted logic signal of that of the output signal of the EXOR circuit is outputted from the NAND circuit.

FIG. 20B is a timing waveform chart (a waveform chart of the input and output signals and an internal signal) showing an example of the operation of the circuit of FIG. 20A controlled by the output signal F of the fuse judging circuit 2 after being driven by the output signal A (pulse signal) of the address input circuit 1 in the case where the circuit of FIG. 20A is selected. FIG. 20C is a timing waveform chart (a waveform chart of the input and output signals and the internal signal) showing an example of the operation of the circuit of FIG. 20A controlled by the output signal F of the fuse judging circuit 2 after being driven by the output signal A (pulse signal) of the address input circuit 1 in the case where the circuit of FIG. 20A is not selected.

During an interval of time T1 to T2, the output signal A of the address input circuit 1 is at the “H” level, the output signal F of the fuse judging circuit 2 is also at the “H” level, the output signal of the EXOR circuit is at the “L” level, and the output signal of the word line driver is at the “H” level.

During an interval of time T2 to T3, the output signal A of the address input circuit 1 is at the “L” level, the output signal F of the fuse judging circuit 2 is at the “H” level, the output signal of the EXOR circuit is at the “H” level, and the output signal of the word line driver starts to become the “L” level.

During an interval of time T3 to T4, in the case where the circuit of FIG. 20A is selected, as shown in FIG. 20B, the output signal A of the address input circuit 1 is at the “H” level, the output signal F of the fuse judging circuit 2 is at the “L” level, the output signal of the EXOR circuit is at the “H” level, the output signal of the word line driver is at the “L” level, and thus the word line WL becomes selected. On the other hand, in the case where the circuit of FIG. 20A is non-selected, as shown in FIG. 20C, the output signal A of the address input circuit 1 is at the “H” level, the output signal F of the fuse judging circuit 2 is at the “H” level, the output signal of the EXOR circuit is at the "L" level, the output signal of the word line driver is returned to the "H" level, and thus the word line WL becomes non-selected.

After time T4, the output signal A of the address input circuit 1 is at the "H" level, the output signal F of the fuse judging circuit 2 is also at the "H" level, the output signal of the EXOR is at the "L" level, and thus the output signal of the word line driver becomes the "H" level.

Figure 21A:
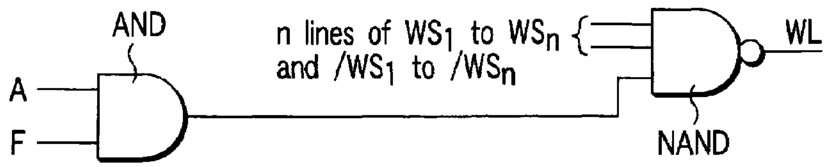
FIG. 21A is a circuit diagram showing a fifth example of the word line driver 3*a* in FIG. 6 for realizing the operation of FIG. 7.

FIG. 21A is a fifth example of a circuit diagram showing the word line driver 3 of the circuit shown in FIG. 6, which is used to realize the operation shown by the signal chart of FIG. 7. Since the circuit diagram of the spare word line driver 4 is the same as that of the normal word line driver circuit 3, only the normal word line driver 3 is shown in FIG. 21A for simplicity.

The circuit shown in FIG. 21A differs from the circuit shown in FIG. 17A in that an AND circuit is used instead of the NAND circuit, and the other parts or portions are the same.

That is, the word line driver shown in FIG. 21A includes an AND circuit at the input stage and a NAND circuit at the output stage. An output signal A of the address input circuit 1 and an output signal F of the fuse judging circuit 2 are inputted to the AND circuit, and an output signal of the AND circuit is inputted to the NAND circuit. Besides the output signal of the AND circuit, n signals of the complimentary word line driver selecting signals $WS_1$ to $WS_n$ and $/WS_1$ to $/WS_n$ (2n signals) are inputted to the NAND circuit.

The word line driver is selected when all inputs of the n word line driver selecting signals become the "H" level, and an inverted logic signal of that of the output signal of the input stage AND circuit is outputted from the NAND circuit.

Figure 21B:
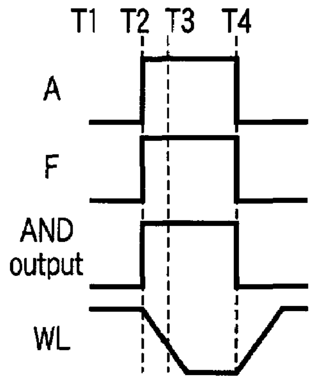
FIG. 21B is a timing waveform chart showing an operation example of a selected state of a word line by the word line driver of FIG. 21A.
Figure 21C:
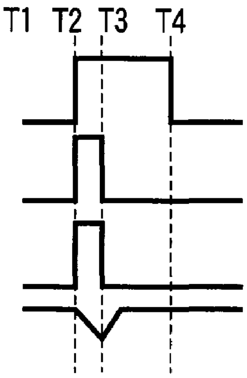
FIG. 21C is a timing waveform chart showing an operation example of a non-selected state of a word line by the word line driver of FIG. 21A.

FIG. 21B is a timing waveform chart (a waveform chart of the input and output signals and an internal signal) showing an example of the operation of the circuit of FIG. 21A controlled by the output signal F of the fuse judging circuit 2 after being driven by the output signal A (pulse signal) of the address input circuit 1 in the case where the circuit of FIG. 21A is selected. FIG. 21C is a timing waveform chart (a waveform chart of the input and output signals and the internal signal) showing an example of the operation of the circuit of FIG. 21A controlled by the output signal F of the fuse judging circuit 2 after being driven by the output signal A (pulse signal) of the address input circuit 1 in the case where the circuit of FIG. 21A is not selected.

During an interval of time T1 to T2, the output signal A of the address input circuit 1 is at the "L" level, the output signal F of the fuse judging circuit 2 is also at the "L" level, the output signal of the input stage AND circuit is at the "L" level, and the output signal of the word line driver is at the "H" level.

During an interval of time T2 to T3, the output signal A of the address input circuit 1 is at the "H" level, the output signal F of the fuse judging circuit 2 is also at the "H" level, the output signal of the AND circuit is at the "H" level, and the output signal of the word line driver starts to become the "L" level.

During an interval of time T3 to T4, in the case where the circuit of FIG. 21A is selected, as shown in FIG. 21B, the output signal A of the address input circuit 1 is at the "H" level, the output signal F of the fuse judging circuit 2 is at the "H" level, the output signal of the AND circuit is at the "H" level, the output signal of the word line driver is at the "L" level, and thus the word line WL becomes selected. On the other hand, in the case where the circuit of FIG. 21A is non-selected, as shown in FIG. 21C, the output signal A of the address input circuit 1 is at the "H" level, the output signal F of the fuse judging circuit 2 is at the "L" level, the output signal of the AND circuit is at the "L" level, the output signal of the word line driver is returned to the "H" level, and thus the word line WL becomes non-selected.

After time T4, the output signal A of the address input circuit 1 is at the "L" level, the output signal F of the fuse judging circuit 2 is also at the "L" level, the output signal of the AND circuit is at the "L" level, and thus the output signal of the word line driver becomes the "H" level.

Figure 22A:
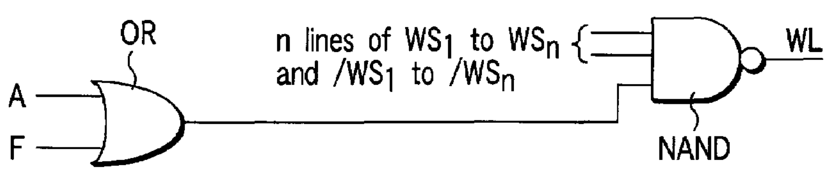
FIG. 22A is a circuit diagram showing a sixth example of the word line driver 3*a* in FIG. 6 for realizing the operation of FIG. 7.

FIG. 22A is a sixth example of a circuit diagram showing the word line driver 3 of the circuit shown in FIG. 6, which is used to realize the operation shown by the signal chart of FIG. 7. Since the circuit diagram of the spare word line driver 4 is the same as that of the normal word line driver circuit 3, only the normal word line driver 3 is shown in FIG. 22A for simplicity.

The circuit shown in FIG. 22A differs from the circuit shown in FIG. 17A in that an OR (logical sum) circuit is used instead of the NAND circuit, and the other parts or portions are the same.

That is, the word line driver shown in FIG. 22A includes an OR circuit and a NAND circuit. An output signal A of the address input circuit 1 and an output signal F of the fuse judging circuit 2 are inputted to the OR circuit, and an output signal of the OR circuit is inputted to the NAND circuit. Besides the output signal of the OR circuit, n signals of the complimentary word line driver selecting signals $WS_1$ to $WS_n$ and $/WS_1$ to $/WS_n$ (2n signals) are inputted to the NAND circuit.

The word line driver is selected when all inputs of the n word line driver selecting signals become the "H" level, and an inverted logic signal of that of the output signal of the OR circuit is outputted from the NAND circuit.

Figure 22B:
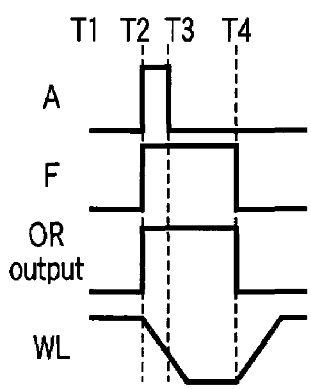
FIG. 22B is a timing waveform chart showing an operation example of a selected state of a word line by the word line driver of FIG. 22A.
Figure 22C:
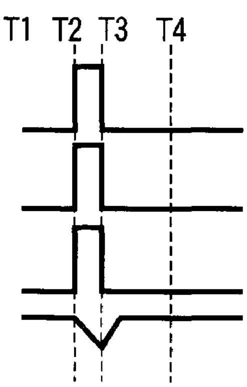
FIG. 22C is a timing waveform chart showing an operation example of a non-selected state of a word line by the word line driver of FIG. 22A.

FIG. 22B is a timing waveform chart (a waveform chart of the input and output signals and an internal signal) showing an example of the operation of the circuit of FIG. 22A controlled by the output signal F of the fuse judging circuit 2 after being driven by the output signal A (pulse signal) of the address input circuit 1 in the case where the circuit of FIG. 22A is selected. FIG. 22C is a timing waveform chart (a waveform chart of the input and output signals and the internal signal) showing an example of the operation of the circuit of FIG. 22A controlled by the output signal F of the fuse judging circuit 2 after being driven by the output signal A (pulse signal) of the address input circuit 1 in the case where the circuit of FIG. 22A is not selected.

During an interval of time T1 to T2, the output signal A of the address input circuit 1 is at the "L" level, the output signal F of the fuse judging circuit 2 is also at the "L" level, the output signal of the OR circuit is at the "L" level, and the output signal of the word line driver is at the "H" level.

During an interval of time T2 to T3, the output signal A of the address input circuit 1 is at the "H" level, the output signal F of the fuse judging circuit 2 is also at the "H" level, the output signal of the OR circuit is at the "H" level, and the output signal of the word line driver starts to become the "L" level.

During an interval of time T3 to T4, in the case where the circuit of FIG. 22A is selected, as shown in FIG. 22B, the output signal A of the address input circuit 1 is at the "L" level, the output signal F of the fuse judging circuit 2 is at the "H" level, the output signal of the OR circuit is at the "H" level, the output signal of the word line driver is at the "L" level, and thus the word line WL becomes selected. On the other hand, in the case where the circuit of FIG. 22A is non-selected, as shown in FIG. 22C, the output signal A of the address input circuit 1 is at the "L" level, the output signal F of the fuse judging circuit 2 is at the "L" level, the output signal of the OR circuit is at the "L" level, the output signal of the word line driver is returned to the "H" level, and thus the word line WL becomes non-selected.

After time T4, the output signal A of the address input circuit 1 is at the "L" level, the output signal F of the fuse judging circuit 2 is also at the "L" level, the output signal of the OR is at the "L" level, and thus the output signal of the word line driver becomes the "H" level.

Various examples of the normal word line driver 3 (FIG. 3) are shown in FIG. 11A, FIG. 12A, FIG. 13A, FIG. 14A, FIG. 15A, FIG. 16A, FIG. 17A, FIG. 18A, FIG. 19A, FIG. 20A, FIG. 21A, and FIG. 22A. The spare word line driver 4 (FIG. 3) has the same configuration as the normal word line drivers shown in FIG. 11A, FIG. 12A, FIG. 13A, FIG. 14A, FIG. 15A, FIG. 16A, FIG. 17A, FIG. 18A, FIG. 19A, FIG. 20A, FIG. 21A, and FIG. 22A. However, input signals A' and F' and n signals of the spare word line driver selecting signals $SWS_1$ to $SWS_n$ and $/SWS_1$ to $/SWS_n$ are inputted to the spare word line driver, instead of the input of the input signals A and F and the n signals of the normal word line driver selecting signals $WS_1$ to $WS_n$ and $/WS_1$ to $WS_n$ inputted to the normal word line driver.

FIG. 23A is an example of a circuit diagram showing a circuit used to realize the operation shown by the signal chart of FIG. 5 and the operation shown by the signal chart of FIG. 8.

This circuit lengthens a pulse width (between time T2 and time T3) of the output signal A of the address input circuit 1 in FIG. 3 and a pulse width (between time T2 and time T3) of the output signal A' of the address input circuit 1 in FIG. 6 to generate a signal A" of the specific pulse width.

This circuit includes an OR circuit and a DELAY circuit. The input signal A of the address input circuit 1 is inputted to the OR circuit and DELAY circuit. The output of the DELAY is inputted to the OR.

When the signal A is inputted, the OR circuit carries out an OR logic operation of the inputted address signal. A and a delayed address signal N1 obtained by the signal A to generate the signal A" having the pulse width longer than that of the signal A.

FIG. 23B is a timing waveform chart showing an operation of the circuit of FIG. 23 A.

By sufficiently lengthening the pulse width (between T2 and T3) of the signals A and A', the normal word line WL of the non-selected normal memory cell and the spare word line SWL of the non-selected spare memory cell can be returned to the non-selected state after setting the normal word line WL and the spare word line SWL to the selected state, and the operations shown in FIG. 5 and FIG. 8 can be realized.

As described above, according to the semiconductor memory devices according to the embodiments of the present invention, the access time of FeRAM can be shortened.

The embodiments of the present invention are not limited to the described FeRAM integrated circuits, and can be applied to semiconductor memory devices (including a memory/logic integration type) mounting FeRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:

a normal memory cell array in which a plurality of normal memory cells each comprising a ferroelectric capacitor are arranged;

a normal word line which is connected to the normal memory cells of the normal memory cell array;

a normal word line driver which selectively drives the normal word line;

a normal plate line which is connected to the normal memory cells of the normal memory cell array;

a spare memory cell array in which a plurality of spare memory cells each comprising a ferroelectric capacitor are arranged, the spare memory cells being used as a substitution of a faulty normal memory cell of the normal memory cell array;

a spare word line which is connected to the spare memory cells of the spare cell array;

a spare word line driver which selectively drives the spare word line;

a spare plate line which is connected to the spare memory cells of the spare memory cell array;

an address input circuit to which an address signal for selectively specifying the memory cells is inputted; and a judging circuit which compares an address inputted in the address input circuit with a faulty address previously stored and generates an output signal for selecting one of the normal word line driver and spare word line driver according to a result of the comparison, wherein the normal word line driver and spare word line driver are simultaneously selected by an output signal of the address input circuit to start driving the normal word line and spare word line, after the start of the driving of the normal word line and spare word line and before the normal plate line or spare plate line is driven, the normal word line driver and spare word line driver are selected by the output signal of the judging circuit to stop the driving of one of the normal word line and spare word line, return the potential of the one of the normal word line and spare word line to its respective inactivation level, and continue the other of the driving of the normal word line and spare word line, each of the normal memory cells comprises a cell transistor whose gate is connected to a corresponding one of the normal word lines and the ferroelectric capacitor connected to one terminal of the cell transistor, each of the spare memory cells comprises a cell transistor whose gate is connected to a corresponding spare word line and the ferroelectric capacitor connected to one terminal of the cell transistor, a bit line is connected to one terminals of the normal memory cell and spare memory cell, a normal plate line is connected to the other terminal of the normal memory cell, a spare plate line is connected to the other terminal of the spare memory cell, the normal word line driver and spare word line driver start to drive the normal word line and spare word line, the normal plate line and spare plate line are selectively driven after the start of the driving, the normal plate line and spare plate line being connected to the normal memory cell and spare memory cell to which the normal and spare word lines and spare word lines are connected, the normal word line and spare word line are started to be driven by the normal word line driver and spare word line driver so that a potential of the normal word line and spare word line changes toward an activation level, the driving of one of the normal word line and spare word line caused by the normal word line driver and spare word line driver is stopped and the driving of the other of the normal word line and spare word line is continued, before the potential of the normal word line and spare word line reaches the activation level, the normal word line driver comprises a first logic circuit which carries out a logic operation of a pulse signal A outputted from the address input circuit and an output signal F outputted from the judging circuit, and a second logic circuit to which a plurality of normal word line selecting signals and an output signal of the first logic circuit are inputted, and from which an output signal having the same logic level as that of the output signal of the first logic circuit is outputted, the spare word line driver has the same configuration as that of the word line driver and comprises a first logic circuit which carries out a logic operation of a pulse signal A' outputted from the address input circuit and an output signal F' outputted from the judging circuit, and a second logic circuit to which a plurality of spare word line selecting signals and an output signal of the first logic circuit are inputted, and from which a signal having the same logic level as that of the output signal of the first logic circuit is outputted, the input signals A' and F' corresponding to the input signals A and F inputted to the normal word line driver, respectively, and the plurality of spare word line selecting signals corresponding to the plurality of word line selecting signals inputted to the normal word line driver, and a width of the pulse signal A outputted from the address input circuit is shorter than a rise time of the output signals of the second logic circuits of the normal word line driver and the spare word line driver.

2. A semiconductor memory device according to claim 1, wherein each the second logic circuits of the normal word line driver and spare word line driver normal word line driver comprises an AND circuit.

3. A semiconductor memory device, comprising:

a normal memory cell array in which a plurality of normal memory cells each comprising a ferroelectric capacitor are arranged;

a normal word line which is connected to the normal memory cells of the normal memory cell array;

a normal word line driver which selectively drives the normal word line;

a normal plate line which is connected to the normal memory cells of the normal memory cell array;

a spare memory cell array in which a plurality of spare memory cells each comprising a ferroelectric capacitor are arranged, the spare memory cells being used as a substitution of a faulty normal memory cell of the normal memory cell array;

a spare word line which is connected to the spare memory cells of the spare cell array;

a spare word line driver which selectively drives the spare word line;

a spare plate line which is connected to the spare memory cells of the spare memory cell array;

an address input circuit to which an address signal for selectively specifying the memory cells is inputted; and a judging circuit which compares an address inputted in the address input circuit with a faulty address previously stored and generates an output signal for selecting one of the normal word line driver and spare word line driver according to a result of the comparison, wherein the normal word line driver and spare word line driver are simultaneously selected by an output signal of the address input circuit to start driving the normal word line and spare word line, after the start of the driving of the normal word line and spare word line and before the normal plate line or spare plate line is driven, the normal word line driver and spare word line driver are selected by the output signal of the judging circuit to stop the driving of one of the normal word line and spare word line, return the potential of the one of the normal word line and spare word line to its respective inactivation level, and continue the other of the driving of the normal word line and spare word line, each of the normal memory cells comprises a cell transistor whose gate is connected to a corresponding one of the normal word lines and the ferroelectric capacitor connected to one terminal of the cell transistor, each of the spare memory cells comprises a cell transistor whose gate is connected to a corresponding spare word line and the ferroelectric capacitor connected to one terminal of the cell transistor, a bit line is connected to one terminals of the normal memory cell and spare memory cell, a normal plate line is connected to the other terminal of the normal memory cell, a spare plate line is connected to the other terminal of the spare memory cell, the normal word line driver and spare word line driver start to drive the normal word line and spare word line, the normal plate line and spare plate line are selectively driven after the start of the driving, the normal plate line and spare plate line being connected to the normal memory cell and spare memory cell to which the normal and spare word lines and spare word lines are connected, the normal word line and spare word line are started to be driven by the normal word line driver and spare word line driver so that a potential of the normal word line and spare word line changes toward an activation level, the driving of one of the normal word line and spare word line caused by the normal word line driver and spare word line driver is stopped and the driving of the other of the normal word line and spare word lines is continued, after the potential of the normal word line and the spare word line has reached the activation level, the normal word line driver comprises a first logic circuit which carries out a logic operation of a pulse signal A outputted from the address input circuit and an output signal F outputted from the judging circuit, and a second logic circuit to which a plurality of normal word line selecting signals and an output signal of the first logic circuit are inputted, and from which an output signal having the same logic level as that of the output signal of the first logic circuit is outputted, the spare word line driver has the same configuration as that of the word line driver and comprises a first logic circuit which carries out a logic operation of a pulse signal A' outputted from the address input circuit and an output signal F' outputted from the judging circuit, and a second logic circuit to which a plurality of spare word line selecting signals and an output signal of the first logic circuit are inputted, and from which a signal having the same logic level as that of the output signal of the first logic circuit is outputted, the input signals A' and F' corresponding to the input signals A and F inputted to the normal word line driver, respectively, and the plurality of spare word line selecting signals corresponding to the plurality of word line selecting signals inputted to the normal word line driver, and a width of the pulse signal A outputted from the address input circuit is larger than a rise time of the output signals of the second logic circuits of the normal word line driver and the spare word line driver.

4. A semiconductor memory device according to claim 3, wherein each the second logic circuits of the normal word line driver and spare word line driver normal word line driver comprises an AND circuit.

5. A semiconductor memory device, comprising:

a normal memory cell array in which a plurality of normal memory cells each comprising a ferroelectric capacitor are arranged;

a normal word line which is connected to the normal memory cells of the normal memory cell array;

a normal word line driver which selectively drives the normal word line;

a normal plate line which is connected to the normal memory cells of the normal memory cell array;

a spare memory cell array in which a plurality of spare memory cells each comprising a ferroelectric capacitor are arranged, the spare memory cells being used as a substitution of a faulty normal memory cell of the normal memory cell array;

a spare word line which is connected to the spare memory cells of the spare cell array;

a spare word line driver which selectively drives the spare word line;

a spare plate line which is connected to the spare memory cells of the spare memory cell array;

an address input circuit to which an address signal for selectively specifying the memory cells is inputted; and a judging circuit which compares an address inputted in the address input circuit with a faulty address previously stored and generates an output signal for selecting one of the normal word line driver and spare word line driver according to a result of the comparison, wherein the normal word line driver and spare word line driver are simultaneously selected by an output signal of the address input circuit to start driving the normal word line and spare word line, after the start of the driving of the normal word line and spare word line and before the normal plate line or spare plate line is driven, the normal word line driver and spare word line driver are selected by the output signal of the judging circuit to stop the driving of one of the normal word line and spare word line, return the potential of the one of the normal word line and spare word line to its respective inactivation level, and continue the other of the driving of the normal word line and spare word line, each of the normal memory cells comprises, a ferroelectric memory cell of TC-parallel unit series connection type in which a plurality of normal memory cell units are connected in series, each of the normal memory cell units comprising a cell transistor whose gate is connected to a corresponding normal word line and the ferroelectric capacitor connected between a source and a drain of the cell transistor, and a normal block selecting transistor to which a normal block selecting line is connected, each of the spare memory cells comprises, a ferroelectric memory cell array of TC-parallel-unit series connection type in which a plurality of spare memory cell units are connected in series, each of the spare memory cell units comprising a cell transistor whose gate is connected to a corresponding spare word line and the ferroelectric capacitor connected between a source and a drain of the cell transistor, and a spare block selecting transistor to which a spare block selecting line is connected, a bit line is connected to one terminal of the normal memory cell through the normal block selecting transistor and to one terminal of the spare memory cell through the spare block selecting transistor, the normal plate line is connected to the other terminal of the normal memory cell, the spare plate line is connected to the other terminal of the spare memory cell, before the normal plate line and normal block selecting line are driven or before the spare plate line and spare block selecting line are driven, the normal word line driver and spare word line driver are selected by the output signal of the judging circuit to stop the driving of the one of the normal word line and spare word line, return the potential of the one of the normal word line and spare word line to its respective inactivation level, and continue the other of the driving of the normal word line and spare word line, the normal word line driver and spare word line driver start driving the normal word line and spare word line, the normal and spare block selecting transistors are selectively driven after the start of the driving of the normal word line and spare word line, the normal and spare block selecting transistors being connected to the normal and spare memory cells to which the normal and spare word lines are connected, the normal word line and spare word line start to drive by the normal word line driver and spare word line driver so that a potential of the normal word line and spare word line changes toward an activation level, the driving of one of the normal word line and spare word line caused by the normal word line driver and spare word line driver is stopped and the driving of the other of the normal word line and spare word line is continued, before the potential of the normal word lines and spare word lines reaches the activation level, the normal word line driver comprises a first logic circuit which carries out a logic operation of a pulse signal A outputted from the address input circuit and an output signal F outputted from the judging circuit, and a second logic circuit to which a plurality of normal word line selecting signals and an output signal of the first logic circuit are inputted, and from which an output signal having an inverted logic level of that of the output signal of the first logic circuit is outputted, the spare word line driver has the same configuration as that of the word line driver and comprises a first logic circuit which carries out a logic operation of a pulse signal A' outputted from the address input circuit and an output signal F' outputted from the judging circuit, and a second logic circuit in which a plurality of spare word line selecting signals and an output signal of the first logic circuit are inputted, and from which a signal having the same logic level as that of the output signal of the first logic circuit is outputted, the input signals A' and F' corresponding to the input signals A and F inputted to the normal word line driver, respectively, and the plurality of spare word line selecting signals corresponding to the plurality of word line selecting signals inputted to the normal word line driver, and a width of the pulse signal A outputted from the address input circuit is shorter than a rise time of the output signals of the second logic circuits of the normal word line driver and the spare word line driver.

6. A semiconductor memory device according to claim 5, wherein each of the second logic circuits of the normal word line driver and spare word line driver normal word line driver comprises a NAND circuit.

7. A semiconductor memory device, comprising:

a normal memory cell array in which a plurality of normal memory cells each comprising a ferroelectric capacitor are arranged;

a normal word line which is connected to the normal memory cells of the normal memory cell array;

a normal word line driver which selectively drives the normal word line;

a normal plate line which is connected to the normal memory cells of the normal memory cell array;

a spare memory cell array in which a plurality of spare memory cells each comprising a ferroelectric capacitor are arranged, the spare memory cells being used as a substitution of a faulty normal memory cell of the normal memory cell array;

a spare word line which is connected to the spare memory cells of the spare cell array;

a spare word line driver which selectively drives the spare word line;

a spare plate line which is connected to the spare memory cells of the spare memory cell array;

an address input circuit to which an address signal for selectively specifying the memory cells is inputted; and a judging circuit which compares an address inputted in the address input circuit with a faulty address previously stored and generates an output signal for selecting one of the normal word line driver and spare word line driver according to a result of the comparison, wherein the normal word line driver and spare word line driver are simultaneously selected by an output signal of the address input circuit to start driving the normal word line and spare word line, after the start of the driving of the normal word line and spare word line and before the normal plate line or spare plate line is driven, the normal word line driver and spare word line driver are selected by the output signal of the judging circuit to stop the driving of one of the normal word line and spare word line, return the potential of the one of the normal word line and spare word line to its respective inactivation level, and continue the other of the driving of the normal word line and spare word line, each of the normal memory cells comprises, a ferroelectric memory cell of TC-parallel unit series connection type in which a plurality of normal memory cell units are connected in series, each of the normal memory cell units comprising a cell transistor whose gate is connected to a corresponding normal word line and the ferroelectric capacitor connected between a source and a drain of the cell transistor, and a normal block selecting transistor to which a normal block selecting line is connected, each of the spare memory cells comprises, a ferroelectric memory cell array of TC-parallel-unit series connection type in which a plurality of spare memory cell units are connected in series, each of the spare memory cell units comprising a cell transistor whose gate is connected to a corresponding spare word line and the ferroelectric capacitor connected between a source and a drain of the cell transistor, and a spare block selecting transistor to which a spare block selecting line is connected, a bit line is connected to one terminal of the normal memory cell through the normal block selecting transistor and to one terminal of the spare memory cell through the spare block selecting transistor, the normal plate line is connected to the other terminal of the normal memory cell, the spare plate line is connected to the other terminal of the spare memory cell, before the normal plate line and normal block selecting line are driven or before the spare plate line and spare block selecting line are driven, the normal word line driver and spare word line driver are selected by the output signal of the judging circuit to stop the driving of the one of the normal word line and spare word line, return the potential of the one of the normal word line and spare word line to its respective inactivation level, and continue the other of the driving of the normal word line and spare word line, the normal word line driver and spare word line driver start driving the normal word line and spare word line, the normal and spare block selecting transistors are selectively driven after the start of the driving of the normal word line and spare word line, the normal and spare block selecting transistors being connected to the normal and spare memory cells to which the normal and spare word lines are connected, the normal word line and spare word line are started to be driven by the normal word line driver and spare word line driver so that a potential of the normal word lines and spare word lines changes toward an activation level, the driving of one of the normal word line and spare word line caused by the normal word line driver and spare word line driver is stopped and the driving of the other of the normal word line and spare word line is continued, after the potential of the normal word line and spare word line has reached the activation level, the normal word line driver comprises a first logic circuit which carries out a logic operation of a pulse signal A outputted from the address input circuit and an output signal F outputted from the judging circuit, and a second logic circuit in which a plurality of normal word line selecting signals and an output signal of the first logic circuit are inputted, and from which an output signal having an inverted logic level of that of the output signal of the first logic circuit is outputted, the spare word line driver has the same configuration as that of the word line driver and comprises a first logic circuit which carries out a logic operation of a pulse signal A' outputted from the address input circuit and an output signal F' outputted from the judging circuit, and a second logic circuit in which a plurality of spare word line selecting signals and an output signal of the first logic circuit are inputted, and from which a signal having the same logic level as that of the output signal of the first logic circuit is outputted, the input signals A' and F' corresponding to the input signals A and F inputted to the normal word line driver, respectively, and the plurality of spare word line selecting signals corresponding to the plurality of word line selecting signals inputted to the normal word line driver, and a width of the pulse signal A outputted from the address input circuit is larger than a rise time of the output signals of the second logic circuits of the normal word line driver and the spare word line driver.

8. A semiconductor memory device according to claim 7, wherein each the second logic circuits of the normal word line driver and spare word line driver normal word line driver comprises a NAND circuit.

* * * * *